(12) United States Patent
Kishimoto et al.

(10) Patent No.: US 10,997,906 B2
(45) Date of Patent: May 4, 2021

(54) ORGANIC EL DISPLAY APPARATUS WITH REDUCED SURFACE ROUGHNESS AND ELECTRODE HAVING SILVER AND ITO AND MANUFACTURING METHOD THEREFOR

(71) Applicant: SAKAI DISPLAY PRODUCTS CORPORATION, Sakai (JP)

(72) Inventors: Katsuhiko Kishimoto, Sakai (JP); Yukiya Nishioka, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/625,675

(22) PCT Filed: Mar. 28, 2018

(86) PCT No.: PCT/JP2018/012911
§ 371 (c)(1),
(2) Date: Apr. 17, 2020

(87) PCT Pub. No.: WO2019/186810
PCT Pub. Date: Oct. 3, 2019

(65) Prior Publication Data
US 2021/0005134 A1     Jan. 7, 2021

(51) Int. Cl.
*G09G 3/3225*     (2016.01)
*H01L 51/52*      (2006.01)
*H01L 51/56*      (2006.01)

(52) U.S. Cl.
CPC ....... *G09G 3/3225* (2013.01); *H01L 51/5212* (2013.01); *H01L 51/56* (2013.01)

(58) Field of Classification Search
CPC .... G09G 3/3225; H01L 51/5212; H01L 51/56
See application file for complete search history.

(56) References Cited

U.S. PATENT DOCUMENTS

2007/0235777 A1   10/2007   Nagata
2012/0176025 A1   7/2012    Lee et al.
(Continued)

FOREIGN PATENT DOCUMENTS

JP    H02-275672 A    11/1990
JP    2006-252774 A    9/2006
(Continued)

OTHER PUBLICATIONS

International Search Report for International application No. PCT/JP2018/012911.

*Primary Examiner* — Lex H Malsawma
(74) *Attorney, Agent, or Firm* — ScienBiziP, P.C.

(57) ABSTRACT

The present invention is equipped with a substrate upon which a drive circuit containing a TFT, a planarization film, and an OLED are formed. The TFT is provided with a gate electrode, a drain electrode, a source electrode, and a semiconductor layer with regions serving as the channel and extends along a prescribed direction. The drain electrode and the source electrode are disposed such that respective portions of the drain electrode and the source electrode are arranged in an alternating manner along the prescribed direction. The connection between the drive circuit and the OLED is achieved via a conductor layer with a Ti layer and a Cu layer (Cu alloy layer) and is embedded in the interior of a contact hole formed in the planarization film, and the surface of the planarization film is formed with an arithmetic mean roughness Ra of no more than 50 nm.

7 Claims, 13 Drawing Sheets

(56) References Cited

U.S. PATENT DOCUMENTS

| | | | |
|---|---|---|---|
| 2013/0062608 A1 | 3/2013 | Hirai | |
| 2014/0054782 A1 | 2/2014 | Morita et al. | |
| 2014/0361261 A1* | 12/2014 | Choi | H01L 51/5218 257/40 |
| 2016/0043060 A1 | 2/2016 | Kabe et al. | |
| 2018/0122883 A1* | 5/2018 | Beak | H01L 27/3248 |
| 2019/0189710 A1* | 6/2019 | Lee | H01L 51/5231 |

FOREIGN PATENT DOCUMENTS

| | | |
|---|---|---|
| JP | 2007-281155 A | 10/2007 |
| JP | 2010-129881 A | 6/2010 |
| JP | 2010-272664 A | 12/2010 |
| JP | 2013-062307 A | 4/2013 |
| JP | 2014-041946 A | 3/2014 |
| JP | 2014-120487 A | 6/2014 |
| JP | 2016-153888 A | 8/2016 |
| JP | 2017-011173 A | 1/2017 |
| WO | 2014/184988 A1 | 11/2014 |

* cited by examiner

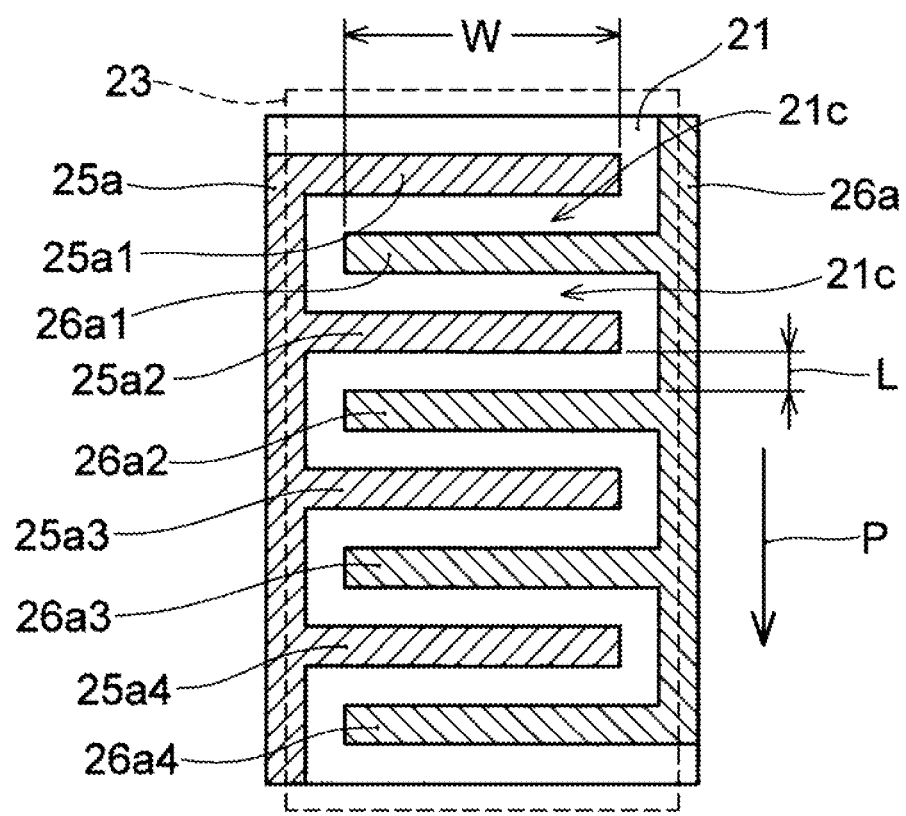

ORGANIC EL DISPLAY APPARATUS WITH REDUCED SURFACE ROUGHNESS AND ELECTRODE HAVING SILVER AND ITO AND MANUFACTURING METHOD THEREFOR

TECHNICAL FIELD

The present invention relates to an organic-EL display apparatus and a manufacturing method of an organic-EL display apparatus.

BACKGROUND ART

In recent years, there is a trend in which an organic-EL display apparatus is being adopted in a large-sized television, a mobile apparatus, or the like. The organic-EL display apparatus is configured such that a drive circuit is formed, on an insulating substrate, using a thin-film transistor (below-called also a TFT) as an active element such as a switching element and a drive element in a region of each pixel and an organic light-emitting element of each pixel is formed thereon such that the organic light-emitting element of each pixel connects to the TFT. The organic-EL display apparatus is categorized into a top emission-type having a top surface of a light-emitting element as a display surface and a bottom emission-type having a rear surface of the insulating substrate as a display surface, wherein, in the top emission-type, the previously-described drive circuit is formed therebelow, independent of the display region of the organic light-emitting element. On the other hand, in the bottom emission-type, the drive circuit is formed in the surrounding of the display region. Therefore, in a small-sized organic-EL display apparatus such as a mobile apparatus having a small space to form the drive circuit, a configuration being made as that of the top emission-type such that the drive circuit such as the TFT is formed below almost the entire surface of the display region is often used. On the other hand, the configuration of the bottom emission-type is suitable for a large-sized television, or the like with some room in the space between pixels.

The semiconductor for the TFT being used for the above-mentioned drive circuit is formed by forming a layer of semiconductor formed of amorphous silicon. However, amorphous silicon (below-called also a-Si) has a small electron mobility, so that it is used by modifying it into a low-temperature polysilicon (low-temperature polycrystalline silicon: below also LTPS) by irradiation of laser light in a case that much current is needed. In the organic-EL display apparatus, the organic light-emitting element (below-called also OLED) is driven by current, so that it is necessary to pass a large amount of current in the TFT as the drive element therefor. Therefore, it is essential to modifying a-Si into LTPS.

Moreover, forming the drive circuit using the TFT causes unevenness to be produced on the surface thereof. The OLED is formed thereon, so that a planarizing layer is formed by coating over the drive circuit using a resin material. In this way, planarizing of the surface is carried out. Conventionally, the above-mentioned planarizing layer was obtained in which an inorganic insulating layer to constitute a barrier layer is formed after the TFT is formed, a contact hole to connect the previously-described. OLED and TFT is formed by a photolithography process, and a photosensitive organic insulating layer is formed thereon by a photolithography process and forming of the contact hole by a wet development. In this way, the organic insulating layer is formed to allow the unevenness of the surface due to forming of the TFT and so on to be planarized.

Patent document 1 discloses a TFT and a manufacturing method of thereof, allowing a small occupied area and excellent transistor characteristics being preferable for a switching element for each pixel of an active matrix-type display apparatus to go hand in hand. In the above TFT and the manufacturing method of thereof, a plurality of TFT layers in which the TFTs have the same configuration are integrally formed in a vertical manner via an interlayer insulating layer in which the unevenness of the surface is brought to be 20 nm or less by a CMP process. In other words, at the time of forming a fine TFT, the planarity of the surface of the interlayer insulating layer is brought to be 20 nm or less to deal with a shallow focal depth, so that it is not planarizing to form the OLED over the TFT.

PRIOR ART DOCUMENT

Patent Document

Patent Document 1: 2017-011173 A

SUMMARY OF THE INVENTION

Problem to be Solved by the Invention

As described previously, large current passes in the drive element in the OLED, so that an adequate operation cannot be obtained with a-Si. However, in a case of modifying it into LTPS by irradiation of the laser light, it is difficult to irradiate, onto a large area, laser light having a uniform intensity. In conjunction with upsizing of the display apparatuses and price reduction in electronic apparatuses in recent years in particular, forming a large number of units at once using a large-sized mother substrate is carried out, the size of which mother substrate being up sized to G12 at the present from G6 (approximately 1500 mm×1850 min) with a liquid crystal display apparatus, for example, and approximately 2850 mm×3050 mm even with G10. Irradiation of the laser light being carried out while scanning the partial irradiation positions in order to irradiate the laser light onto such a large-sized mother substrate does not make the intensity of laser light uniform even with partial irradiation and, furthermore, irradiation of the laser light being carried out while scanning causes irradiation to be extremely non-uniform. The intensity of the laser light differing causes the degree of crystallization to be different, causing the drive current to be different even with the same voltage. There is a problem that drive current being different for each pixel causes luminance to change depending on the pixel, causing display non-uniformity such as luminance non-uniformity or color non-uniformity. In the light of the above, there is a large difference between the OLED being driven by current and a liquid crystal display element being driven by voltage.

Moreover, irradiating while scanning laser light source onto a large mother substrate leads to extensive apparatuses, also causing the cost to increase.

While a method to suppress display non-uniformity circuit-wise by further incorporating TFTs can also be considered in order to overcome luminance non-uniformity caused by pixels as described previously, there is a problem that, as the number of TFTs increases, unevenness further increases below the light-emitting region of the light-emitting element. While, in order to planarize such unevenness, an organic insulating layer can be formed on a drive circuit such as a TFT and an OLED can be formed thereon, as a result of the present inventors having made intensive studies, it has been found that sufficient planarity cannot be obtained by planarizing using the above-mentioned organic insulating layer, causing display non-uniformity such as luminance non-uniformity or color non-uniformity to be produced due to the non-planarity.

Moreover, there is also a problem that, in a case the organic light-emitting layer of the OLED is not planar, increasing the light-emitting output by providing a layer with a large reflectance on the surface of the organic light-emitting layer to create a microcavity causes unevenness to be formed also in a reflection layer, causing irregular reflection to make it not possible to create a complete resonator and making it not possible to obtain an increase in output.

On the other hand, as the planarity to manufacture a fine TFT is not required, while a light being emitted by the organic light-emitting layer does not, need to have a strict planarity such that the surface planarity is 20 nm or less as disclosed in Patent document 1 previously described, it only needs to be planar to the degree that it is emitted with almost the front as the center.

Moreover, for the top emission-type, the anode of the OLED is formed such that it contains Ag (silver) or APC (silver-palladium-copper alloy) having a high reflectance for a visible light in order to increase the light extraction efficiency in the surface direction of the insulating substrate. While there is a need to use, as a conductor layer to connect between the TFT and the OLED, Ag and APC having a low contact resistance to Cu copper), there is a problem that it is difficult to use Cu as a conductive material for the organic-EL display apparatus since it is difficult to subject Cu to fine processing using dry etching.

In view of the circumstances as described above, an object of the present invention is to provide an organic-EL display apparatus and a manufacturing method of an organic-EL display apparatus in which the cost of the organic-EL display apparatus is largely reduced by using a-Si to create a TFT structure in which sufficient current is obtained without modifying a-Si into polysilicon, and display definition is improved by suppressing occurrences of color non-uniformity and/or luminance non-uniformity with stable quality.

Another object of the present invention is to provide an organic-EL display apparatus and a manufacturing method of an organic-EL display apparatus in which display definition is improved by planarizing the surface of the drive circuit to suppress color non-uniformity and/or luminance non-uniformity of the organic-EL display apparatus.

Means to Solve the Problem

An organic-EL display apparatus according to one Embodiment of the present invention comprises a substrate comprising a surface on which is formed a drive circuit comprising a thin-film transistor; a planarizing layer to planarize the surface of the substrate by covering the drive circuit; and an organic light-emitting element comprising a first electrode formed on a surface of the planarizing layer and connected to the drive circuit; an organic light-emitting layer formed over the first electrode, and a second electrode formed over the organic light-emitting layer, wherein the thin-film transistor comprises a gate electrode, a drain electrode, a source electrode, and a semiconductor layer comprising a region to be a channel of the thin-film transistor extending and along a given direction; a first conductor layer comprising the drain electrode and a second conductor layer comprising the source electrode are arranged such that a part of each of the first conductor layer and the second conductor layer is alternately lined up in the given direction; the channel is the semiconductor layer sandwiched between a part of the first conductor layer and a part of the second conductor layer neighboring each other; connecting the drive circuit and the first electrode is carried out via a conductor layer filled at an interior of a contact hole formed in the planarizing layer and the conductor layer comprises a titanium layer and a copper layer or a copper alloy layer; and the surface of the planarizing layer is formed so that arithmetic average roughness Ra is 50 nm or less.

A manufacturing method of an organic-EL display apparatus according to another Embodiment of the present invention comprises: forming, over a substrate, a drive circuit comprising a thin-film transistor; forming an inorganic insulating layer and an organic insulating layer on a surface of the drive circuit; forming, in the organic insulating layer and the inorganic insulating layer, a contact hole to reach the thin-film transistor; forming a conductor layer by forming a titanium layer and a copper layer or a copper alloy layer on a surface of the organic insulating layer and at an interior of the contact hole; planarizing the conductor layer of the surface of the organic insulating layer by removing the conductor layer of the surface of the organic insulating layer by polishing and further polishing the surface of the organic insulating layer; forming a first electrode on a surface of the conductor layer; forming an organic light-emitting layer over the first electrode; and forming a second electrode over the organic light-emitting layer, wherein the thin-film transistor is formed by a deposition structure of a gate electrode, a gate insulating layer, a semiconductor layer comprising a region to be a channel and extending along a region to be a channel, and a first conductor layer to be a drain electrode and a second conductor layer to be a source electrode formed in connection with the semiconductor layer; the first conductor layer and the second conductor layer are formed such that a part of each of the first conductor layer and the second conductor layer is arranged to alternatively line-up in a given direction; and the channel is the semiconductor layer sandwiched between the part of the first conductor layer and the part of the second conductor layer adjacent to each other.

Effects of the Invention

According to Embodiments of the present invention, W/L of the thin-film transistor (TFT) increases, making it possible to configure the TFT for driving the organic light-emitting element using a-Si. As a result, TFT characteristics at each pixel become uniform, making it unlikely for color non-uniformity or luminance non-uniformity to be produced. Moreover, the connection between the TFT and the first electrode of the organic light-emitting element is made by copper or a copper alloy, making it possible to obtain a stable connection with a low resistance and to eliminate variations in connection resistance. Furthermore, the surface of the planarizing, layer is polished to 50 nm or less in arithmetic average roughness Ra, making it possible to eliminate unevenness of the surface thereof microscopically. This makes it possible to obtain light emission being uniform among individual pixels, suppress occurrences of color non-uniformity and/or luminance non-uniformity, and substantially improve the display definition of the organic-EL display apparatus.

BRIEF DESCRIPTION OF THE DRAWINGS

FIG. 2A shows an explanatory view of a plane, the explanatory view to explain a channel portion in FIG. 1A.

EMBODIMENT FOR CARRYING OUT THE INVENTION

Figure 1A:
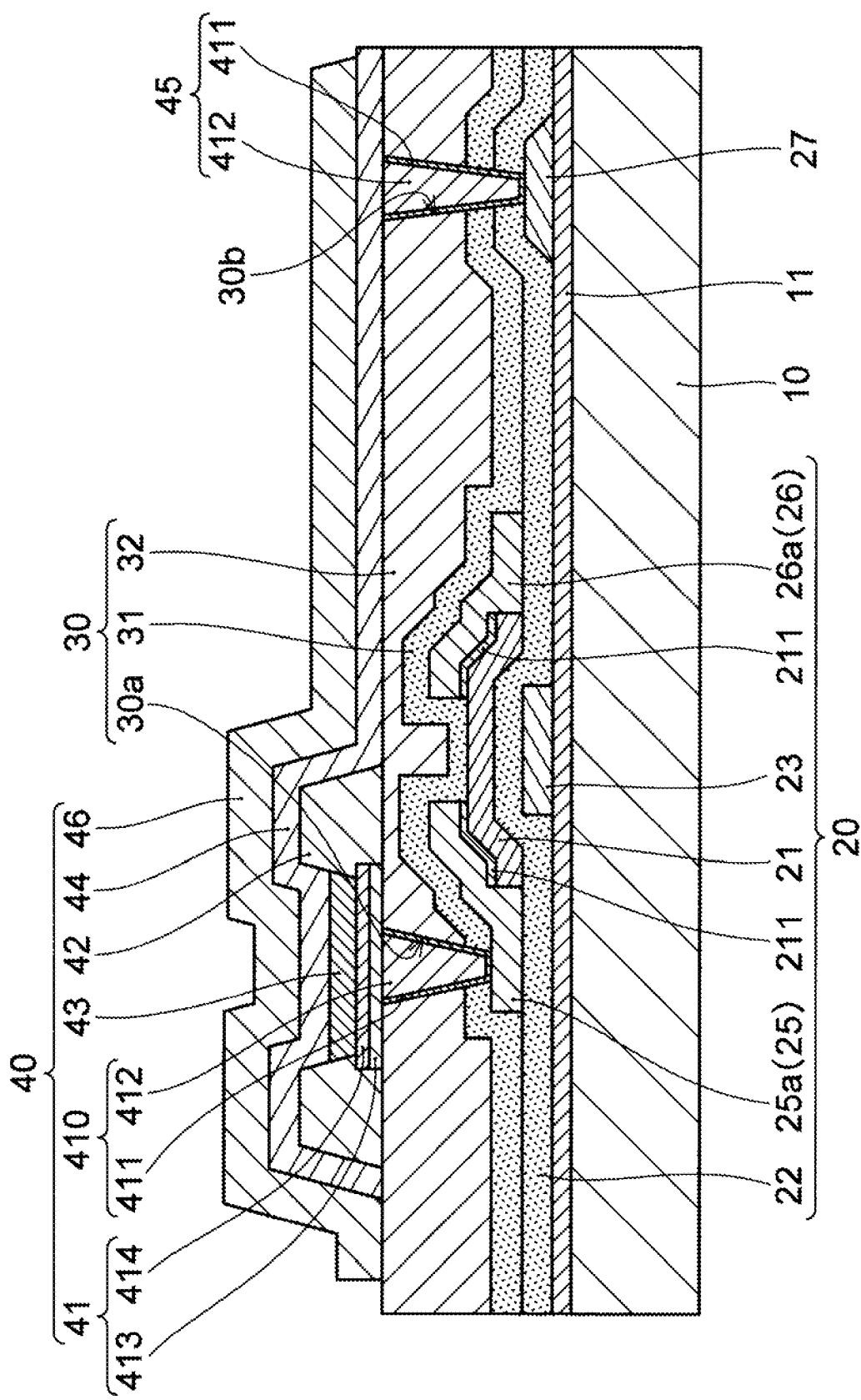
FIG. 1A shows a cross-sectional view of an organic-EL display apparatus according to one Embodiment of the present invention.
Figure 1B:
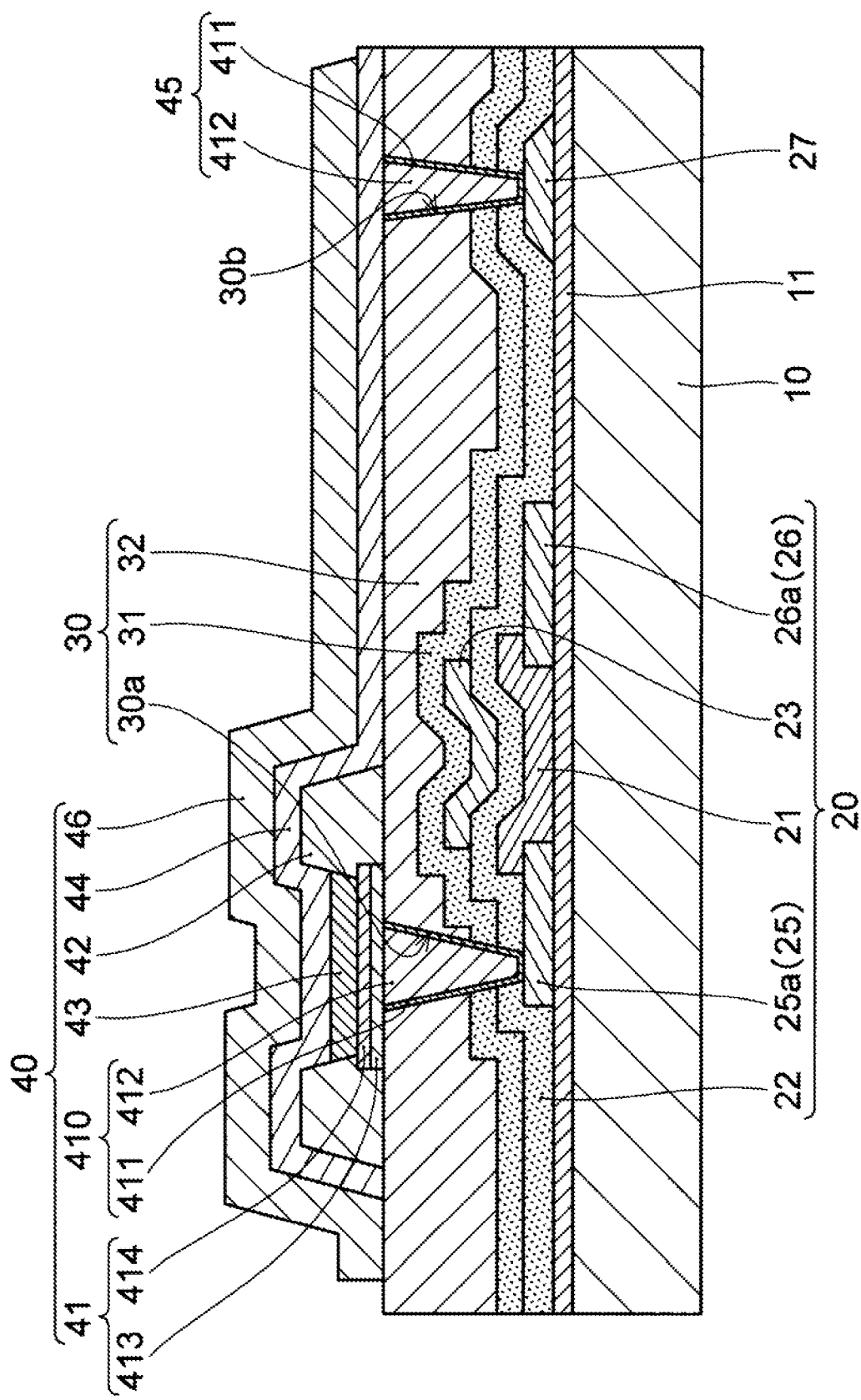
FIG. 1B shows a cross-sectional view of a staggered structure in which a gate electrode of FIG. 1A is made to be the top gate.
Figure 1C:
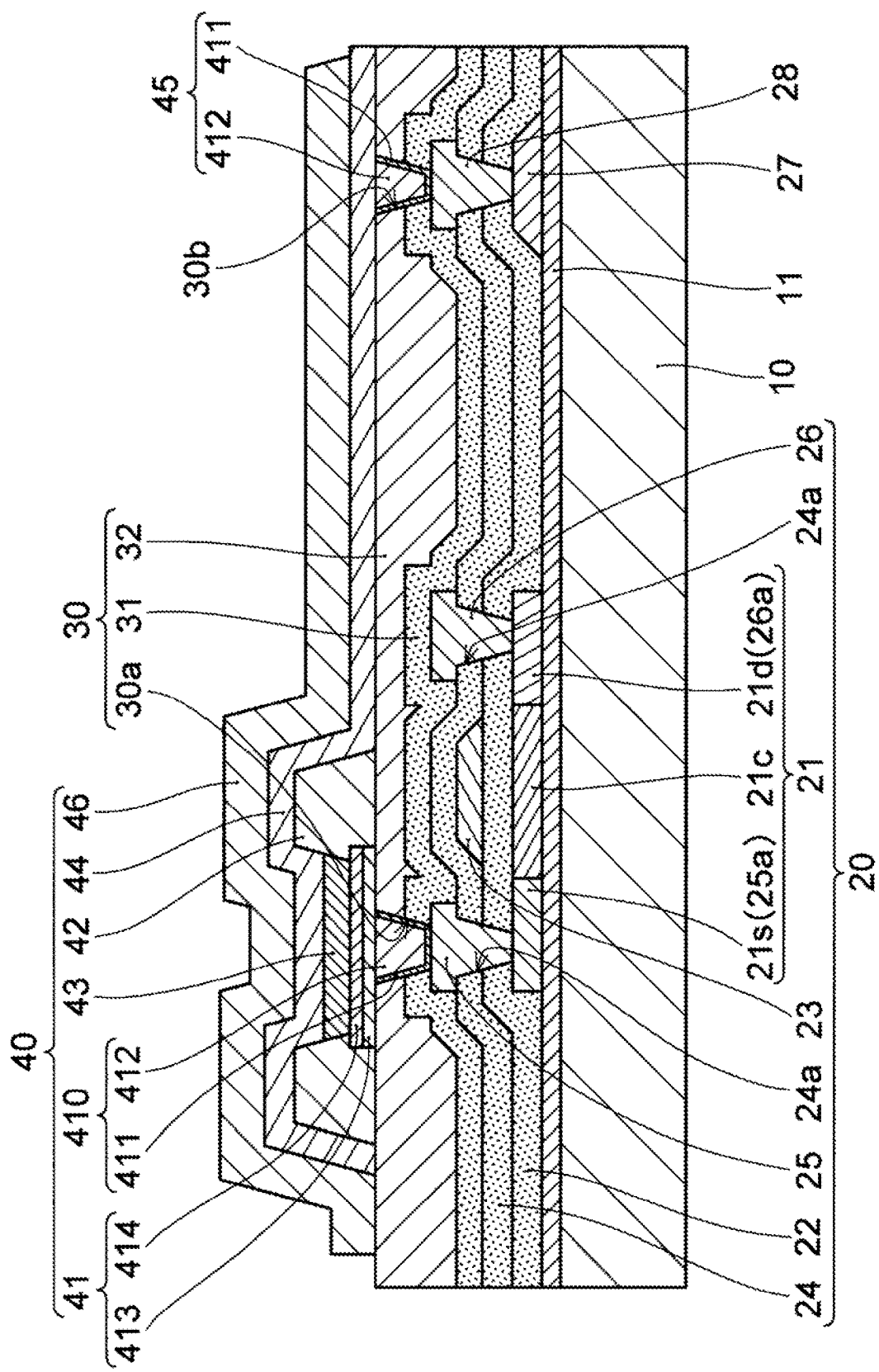
FIG. 1C shows an example of a TFT structure suitable for polysilicon, the structure being the same structure as in FIG. 1B.

Next, an organic-EL display apparatus being one Embodiment of the present invention will be described with reference to the drawings. FIGS. 1A to 1C schematically show a cross-sectional view corresponding to one pixel of the organic-EL display apparatus according to one Embodiment (While the one pixel refers to a sub-pixel of red, green, or blue in one pixel in more strict sense, it can also be referred herein to one pixel also comprising these sub-pixels).

The organic-EL display apparatus according to one Embodiment of the present invention, with an explanatory cross-sectional view thereof being shown in FIG. 1A and an explanatory plan view of the structure of a portion of a channel being shown in FIG. 2A, comprises a substrate 10 comprising a surface on which is formed a drive circuit comprising a TFT 20; a planarizing layer 30 to planarize the surface of the substrate 10 by covering the drive circuit; and an OLED 40 comprising a first electrode 41 being formed on a surface of the planarizing layer 30 and being connected to the drive circuit, an organic, light-emitting layer 43 being formed over the first electrode 41, and a second electrode 44 being formed over the organic light-emitting layer 43. The TFT 20 comprises a gate electrode 23, a drain electrode 26, a source electrode 25, and a semiconductor layer 21 comprising a region to be a channel 21c of the TFT 20 and extending along a given direction P (see FIG. 2A). Moreover, a first conductor layer 26a making up a drain electrode 26 and a second conductor layer 25a making up a source electrode 25 are arranged such that a part 26a1, 26a2 . . . , 25a1, 25a2 . . . , of each of the first conductor layer 26a and the second conductor layer 25a is alternately lined up along a given direction P, and the channel 21c comprises the semiconductor layer 21 being sandwiched between the part 26a1, 26a2 . . . of the first conductor layer 26a and the part 25a1, 25a2 . . . of the second conductor layer 25a neighboring each other. Moreover, a connection between the drive circuit and the first electrode 41 is carried out via a conductor layer 410 being filled at the interior of a contact hole 30a being formed in the planarizing layer 30, the conductor layer 410 comprising a Ti layer 411 and a Cu layer (Cu alloy layer) 412. Then, the surface of the conductor layer 410 being filled on the planarizing layer 30 and at the interior of the contact hole 30a is formed to 50 nm or less in arithmetic average roughness Ra.

In other words, as a result of the present inventors having made intensive studies in order to form the TFT 20 for driving the OLED 40 using an amorphous semiconductor layer having a small electron mobility, they have found that increasing the gate width of the TFT for driving makes it possible to obtain a large current and drive the OLED 40. As described previously, amorphous silicon was conventionally modified into low-temperature polysilicon by irradiating laser light onto amorphous silicon to allow a large current to be passed. However, irradiating laser light uniformly onto a large substrate was very cumbersome such that cost increases to a very large extent and irradiating laser light uniformly onto a large substrate 10 was difficult even when irradiating laser light with great care, causing cases in which sufficient current could not be obtained by the pixels. This caused display non-uniformity such as color non-uniformity or luminance non-uniformity to be produced.

In the present Embodiment, as a large current is obtained by increasing the gate width using a-Si, there are no variations in the TFT characteristics based on irradiation of laser light, making it possible to drive the OLED of individual pixels with uniform characteristics. As a result, an organic-EL display apparatus being excellent in display definition having a stable quality, or in other words, without display non-uniformity as well as having a very simple manufacturing process and being possible to achieve cost reduction can be obtained. A specific structure to increase the channel width will be described below.

The TFT 20 according to the present Embodiment can be formed in a reverse-staggered structure or a staggered structure as shown in FIGS. 1A to 1C. FIG. 1A shows the TFT 20 having a bottom gate structure being the reverse-staggered structure. FIGS. 1A to 1C show views of a cross section of a part along a given direction P in FIG. 2A. FIG. 1B shows a view of a staggered structure of a top gate, while FIG. 1C shows a structure being suitable for polysilicon and also applicable to a-Si, wherein the same letters are affixed to the same parts as in FIG. 1A, so that repeated explanations will be omitted.

In the example shown in FIG. 1A, the gate electrode 23 is formed over the substrate 10 via a base coat layer 11. At this time, a cathode wiring 27 and other wirings being not shown are formed at the same time. Thereover is formed a deposition of the gate insulating layer 22, the semiconductor layer 21 comprising a-Si, and the second conductor layer 25a making up the source electrode 25 and the first conductor layer 26a making up the drain electrode 26. In the example shown in FIG. 1A, a second semiconductor layer having a high impurity concentration is interposed between the semiconductor layer 21, and the first conductor layer 26a and the second conductor layer 25a to improve the electrical contact with the first conductor layer 26a and the second conductor layer 25a, respectively. However, this is not essential, so that impurities can be doped to a portion in which the first conductor layer 26a and the second conductor layer 25a of the semiconductor layer 21 are connected. In the present Embodiment, the semiconductor layer 21 is formed such that the channel width of the channel 21c (see FIG. 2A) thereof is large. In other words, as shown in FIG. 2A, the first conductor layer 26a and the second conductor layer 25a are formed such that a part 26a1, 26a2 . . . , 25a1, 25a2 . . . in which each of the first conductor layer 26a and the second conductor layer 25a is branched as a comb tooth is formed and a comb tooth of each thereof engages with each other.

FIG. 2A is an explanatory plan view of a portion being the channel 21c, wherein a region shown with broken lines is the gate electrode 23, and the semiconductor layer 21 is formed so as to cover the gate electrode 23 via a gate insulating layer being not shown. The first conductor layer 26a and the second conductor layer 25a are formed in connection with the above-mentioned semiconductor layer 21. This deposition structure can be a reverse-staggered structure as shown in FIG. 1A, or can be a staggered structure as shown, in FIG. 1B. In other words, an exemplary structure of a cross section (not a precise cross section) along a first portion 26a1 in FIG. 2A is shown in FIG. 3A as an exemplary reverse-staggered structure, while shown in FIG. 3B as an exemplary staggered structure. In FIGS. 3A and 3B, the same letters are affixed to the same parts as parts as shown in FIGS. 1A and 2A, so that repeated explanations will be omitted.

As shown in FIG. 2A, the first conductor layer 26a and the second conductor layer 25a are formed such that first portions 26a1, 26a2, 26a3, 26a4 being a part of the first conductor layer 26 and second portions 25a1, 25a2, 25a3, 25a4 being a part of the second conductor layer 25 are alternately arranged along a given direction P.

In other words, a portion of the semiconductor layer 21 being sandwiched between the second portion 25a1 being a part of the second conductor layer 25a and the first portion 26a1 being a part of the first conductor layer 26a is the channel 21c, while a portion of the semiconductor layer 21 being sandwiched between the first portion 26a1 and the second portion 25a1 is the channel 21c. This is the same thereafter, so that they are alternately arranged, and the channel 21c is formed in a portion of the semiconductor layer being sandwiched between a first portion 26an and a second portion 25an neighboring each other. Therefore, the channel 21c will be the sum of all of portions in which the first portion 26an and the second portion 25an neighboring each other face each other, the first portion 26an and the second portion 25an being comb tooth portions engaged with each other. Since it is made as a top emission-type even for a small-sized display apparatus such as a smartphone, the above-mentioned channel 21c can be formed on the entire surface of the light-emitting region of the organic light-emitting element 40, making it possible to form a large number of channels 21c. This makes it possible to increase the channel width, making it possible to pass a large current even when the electron mobility is small.

A channel width W of the above-mentioned TFT 20 is W=n·w, where the length of a portion in which the second portion 25a1 and the first portion 26a1 in a set face each other denotes W, and a number of portions in which the second portion 25a1 and the first portion 26a1 face each other denotes n, since the channel width W is a sum of all thereof. On the other hand, a channel length L is the interval between the second portion 25a1 and the first portion 26a1, and is L, in a case where all of the intervals are made equal. Therefore, the W/L ratio between the channel width W and the channel length L can be increased. While the value of the above-mentioned W/L was 2.5 conventionally, the present Embodiment allows it to be made to between 50 and 500. In other words, current can be increased with a larger W/L, and, while the contribution to an increase in current by modifying a-Si into LTPS is approximately 20 times, it can be increased to between 20 and 200 times according to the present Embodiment.

Figure 2B:
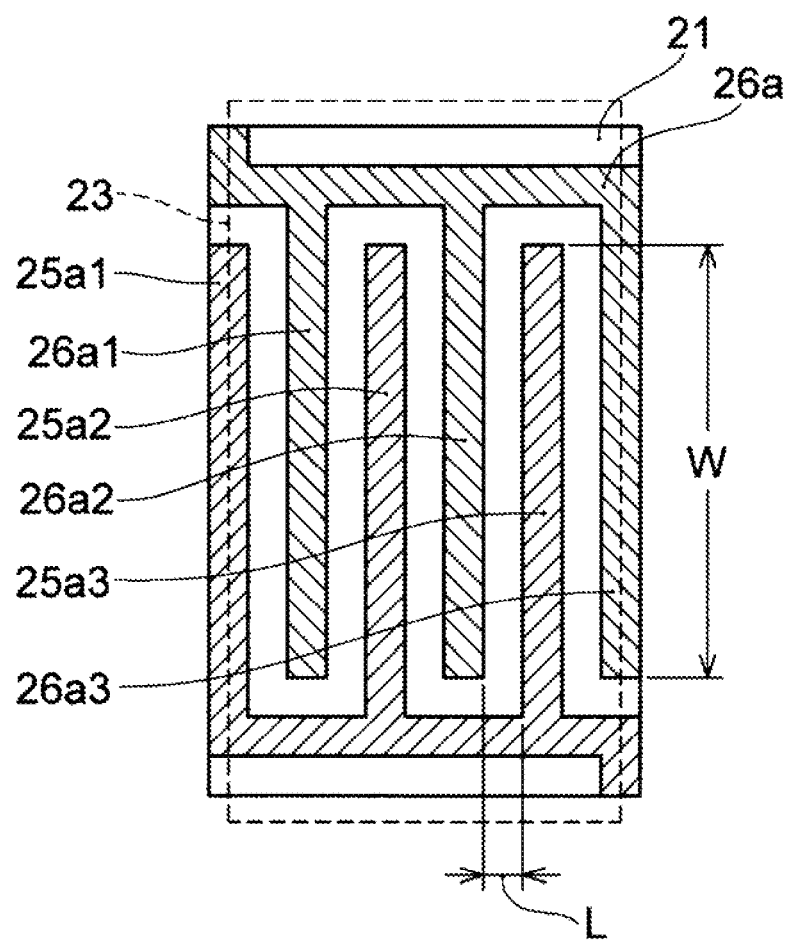
FIG. 2B shows a view of another exemplary arrangement of a first conductor layer and a second conductor layer in FIG. 2A.
Figure 3A:
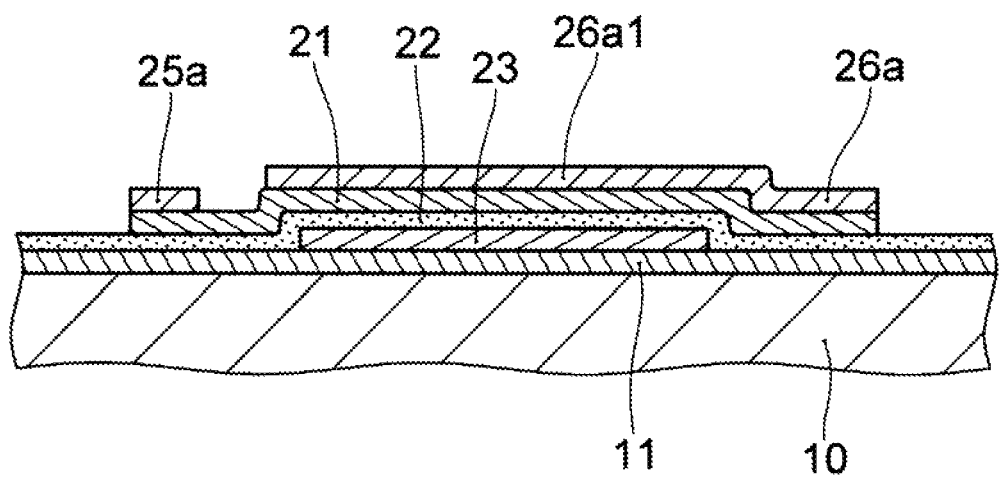
FIG. 3A shows a cross-sectional view of the structure in FIG. 1A, the cross-sectional view being along line IIIA-IIIA in FIG. 2A.
Figure 3B:
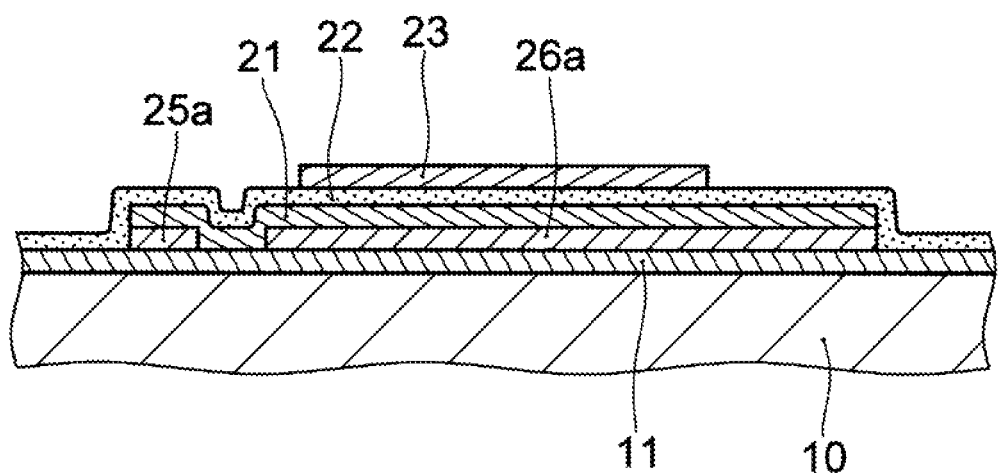
FIG. 3B shows a cross-sectional view of the structure in FIG. 1B, the cross-sectional view being along line IIIA-IIIA in FIG. 2A.

With the structure shown in FIG. 2A, the interval of a portion (a portion having the length of w) in which the second portion 25a1 and the first portion 26a1 face each other being lined up in a given direction is uniform and stably contributes as a channel. However, in a case where the gate electrode 23 is formed in a large size as shown in FIG. 2A, a channel is formed also in a space between the first conductor layer 26a and second conductor layer 25a, the space facing the tip portion of the second portion 25a1 or the first portion 26a1. Therefore, in a case of also forming the above-mentioned interval to the required minimum channel length L, the channel width can be increased further. However, the contribution as the channel of the edge portion of the tip of the first portion 26a1 or second portion 25a1 is unclear, so that the contribution of the above-mentioned tip portion is excluded in the above-mentioned W/L. Therefore, in practice, the channel width is further increased. From such a viewpoint, in case that the light-emitting region, or, in other words, the region in which the channel 21c is formed, has a rectangular shape, the defined length W of the channel width can be increased in a case that the first portion 26a1 and the second portion 25a1 are formed along a long side thereof as shown in FIG. 2B. In FIG. 2B, the same letters are affixed to the same parts in FIG. 2A, so that repeated explanations will be omitted.

Figure 2C:
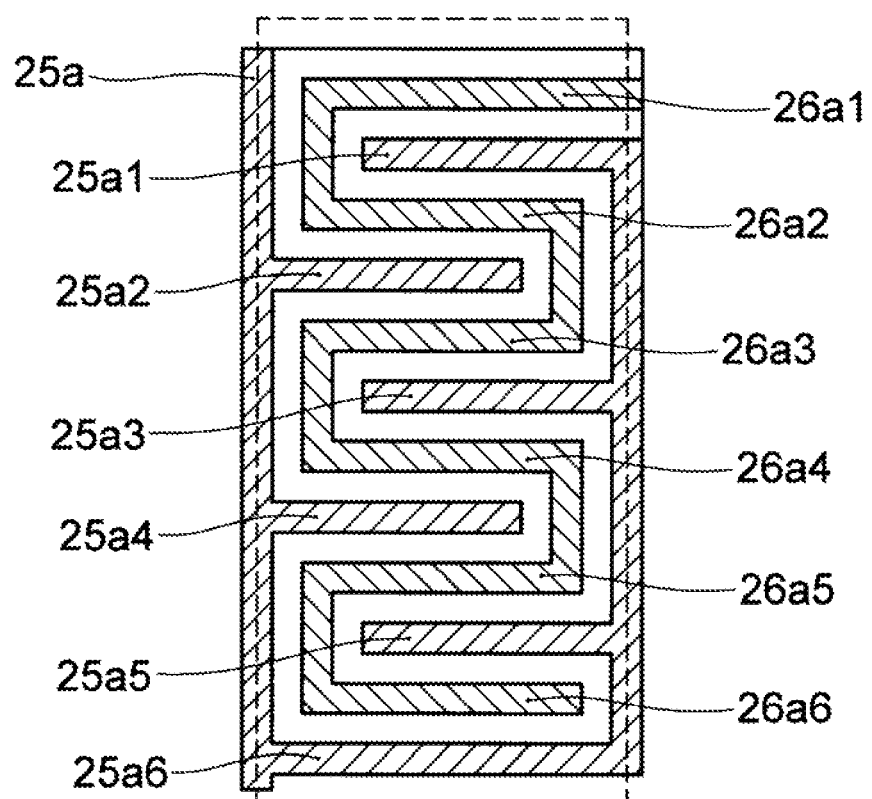
FIG. 2C shows a view of yet another exemplary arrangement of the first conductor layer and the second conductor layer in FIG. 2A.

In FIG. 2C is shown a structure in which the first portions 26a, 26a2, . . . being a part of the first conductor layer 26a are formed not in a shape being branched off the first conductor layer 26a, but being continuously formed in a zigzag manner, and the second portions 25a . . . of the second conductor layer 25a are inserted therebetween, and thereby, the first portions 26a1, . . . of the first conductor layer 26a and the second portions 25a1, . . . of the second conductor layer 25a are alternately arranged. In other words, the structure is not limited to a structure in which comb tooth portions having a comb tooth shape engage with each other as shown in FIG. 2A. In FIG. 2C also, the same letters are affixed to the same parts in FIG. 2A, so that repeated explanations will be omitted.

Moreover, as described previously, as a result of the present inventors having studied intensively the causes in which color non-uniformity and/or luminance non-uniformity of the organic-EL display apparatus is produced, they have found that it is caused by the fact that there is unevenness on the surface of the organic light-emitting layer of the OLED, and, microscopically, the surface of the organic light-emitting layer is not completely planar with the surface being inclined in various directions, or, in other words, the normal direction of the surface of the organic light-emitting layer is inclined in various directions relative to the normal direction of the display surface. In other words, when there is a inclined surface in the light-emitting surface, it will be difficult to recognize light being emitted from a pixel and traveling in a slanted direction in a case of making a visually recognition from a direction being perpendicular to the display surface, causing a decrease in luminance or a change in color by color mixture. In other words, the luminance of the light emitted is the greatest in the normal direction thereof, and it decreases as the light emitted is further inclined from the normal direction thereof. In a small-sized display apparatus such as a smartphone, the size of the sub-pixel thereof is very small with approximately several tens of μm for one side. Therefore, light emission to the front will be very weak in a sub-pixel of which surface of the organic light-emitting layer has unevenness even when the unevenness is slight.

Conventionally, as measures for such color non-uniformity and/or luminance non-uniformity, it is carried out to adjust circuit-wise the luminance of a pixel for which color non-uniformity and/or luminance non-uniformity is found in an inspection after being formed into a product by incorporating a TFT into the external edge of the display panel. Therefore, there is also a problem that the drive circuit gets complicated.

Moreover, describing in further detail, the conventional TFT and the first electrode are connected by using sputtering or vacuum vapor deposition to fill an ITO layer and an Ag layer into a contact hole being formed in the planarizing layer. However, the diameter of the above-mentioned contact hole is small at approximately 5 μm. Even more, the planarizing layer is formed in a structure having at least two layers of the inorganic insulating layer and the organic insulating layer, and therefore, a stepped portion or an undercut is easily produced at the interface therebetween when the two layers are etched at the same time, since the etching rate differs between the inorganic insulating layer and the organic insulating layer. Even when a photosensitive resin is used for the organic insulating layer to separately form a contact hole in the inorganic insulating layer and a contact hole in the organic insulating layer, it is difficult for patterns of the contact holes to match completely, causing a stepped portion to be easily produced. When ITO and Ag or APC is filled into the above-mentioned contact hole using sputtering or vacuum vapor deposition, it difficult for a metal to get into the contact hole as the size of the hole decreases. The present inventors have found that, as a result, the number of air gaps also increases and the electrical resistance between the source electrode of the TFT and the first electrode of the OLED can increase. The present inventors have found that luminance of such a pixel in which the electrical resistance increases decreases, causing luminance non-uniformity to be produced.

Moreover, as described previously, the OLED is formed over the planarizing layer to planarize the surface, over the TFT in which the drive circuit is formed. The surface of the above-mentioned organic insulating layer has a certain degree of planarity, which was considered to be not problematic conventionally. However, as a result of the present inventors having studied intensively, they have found that the surface of the organic insulating layer has approximately between 100 to 300 nm in arithmetic average roughness Ra even when a non-photosensitive resin is used, and a further unevenness is produced with a photosensitive resin being generally used conventionally, and, when the organic light-emitting layer and the electrodes of the OLED are formed on the above-mentioned surface, the surface of the organic light-emitting layer also has the same degree of surface roughness. Unevenness being produced on the surface of the organic light-emitting layer causes the direction in, which light travels when viewed microscopically to vary. The present inventors have found, therefore, that, when the display screen is viewed from the front, light travelling in a slanted direction is difficult to be recognized visually, causing color non-uniformity and/or luminance non-uniformity to be produced. Moreover, they have found that the conductor layer at the interior of the contact hole to connect the TFT of the drive circuit and the first electrode of the OLED is not formed at a low resistance, or, in other words, the resistance in the connecting portion causes current to decrease and luminance to be reduced.

Thus, the present inventors have found that a conductor can be completely filled into the contact hole 30a and be made to have a low resistance by forming the conductor layer 410 to be filled into the contact, hole 30a with the Ti layer 411 to be formed using such as sputtering and the Cu layer 412 to be formed using electroplating with the above-mentioned Ti layer 411 as a seed layer. In other words, even in a case that the Ti layer 411 is formed, using such as sputtering, in the contact hole 30a, as the above-mentioned case is at an initial phase in which a metal layer is formed in the contact hole 30a, the contact hole 30a is also formed uniformly at a large size, and, thereafter, for the Cu layer 412 using electroplating, a plating solution tends to impregnate into the contact hole 30a even when the size thereof is reduced, and the Cu layer 412 is also formed uniformly on the entire surface. The Ti layer 411 has a function of preventing Cu from penetrating into the TFT 20. Moreover, Cu making up the Cu layer 412 can be Cu alloy having the composition of Cu—Mo, for example.

With respect to forming the above-mentioned Ti layer 411, it is formed using such as sputtering, so that it is formed not only at the interior of the contact hole 30a, but also on the entire surface of an organic insulating layer 32. Therefore, the conductor layer 410 on the surface of the organic insulating layer 32 needs to be removed. However, the Cu layer 412 is chemically stable, making it difficult to subject the Cu layer 412 to etching. On the other hand, as previously described, the present inventors have found that the planarity of the surface of the above-mentioned organic insulating layer 32 is also the cause of display non-uniformity such as luminance non-uniformity. Therefore, the Cu layer 412 being formed over the above-mentioned organic insulating layer 32 is removed by polishing and, moreover, the organic insulating layer 32 being exposed by polishing the Cu layer 412 and the Ti layer 411 is also polished. At that time, the surface of the organic insulating layer 32 and the surface of the conductive layer 410 comprising a portion being filled at the interior of the contact hole 30a is polished such that the surface having a fine unevenness as described previously is brought to have the surface roughness being 50 nm or less in arithmetic average roughness Ra, making it possible to suppress color non-uniformity and/or luminance non-uniformity due to the previously-described surface roughness.

In other words, the present Embodiment is characterized in that a metal to be filled at the interior of the contact hole 30*a* is formed of the Ti layer 411 and the Cu layer 412, and, moreover, the surface of the conductor layer 410 being filled at the interior of the contact hole 30*a* and the planarizing layer 30 is polished and formed to 50 nm or less in arithmetic average roughness Ra.

While the smaller the surface roughness the more preferable, as shown in Patent document 1 described previously, it has been found that it is not necessary to have the planarity of 20 nm or less and, even when the surface roughness is 20 nm or more in arithmetic average roughness Ra, almost no color non-uniformity or luminance non-uniformity appears in a case that the connection resistance is stable and sufficiently small. In other words, while the smaller the surface roughness the more preferable, so that no lower limit is to be set, the polishing work will be cumbersome in order to reduce the surface roughness, so that it is preferable that the surface roughness be brought to 20 nm or more, and 50 nm or less in arithmetic average roughness.

In the present Embodiment, moreover, the contact hole 30*a* is formed in the planarizing layer 30, and the conductor layer 410 containing Cu or a Cu alloy having a low contact resistance with Ag or APC making up the first electrode 41 of the OLED 40 is filled into the contact hole 30*a*, making it possible to reduce the resistance between the TFT 20 and the OLED 40. This makes it possible to reduce consumed power of the organic-EL display apparatus.

Structure of Organic-EL Display Apparatus

Next, the organic-EL display apparatus shown in FIG. 1A is specifically explained. FIGS. 1A to 1C schematically show a cross-sectional view of one pixel of the organic-EL display apparatus according to one Embodiment (While the one pixel refers to a sub-pixel of red, green, or blue in one pixel in more strict sense, it can also be referred herein to one pixel also comprising these sub-pixels).

In a case of a bottom emission-type organic-EL display apparatus, the substrate 10 needs to transmit light being emitted by the organic light-emitting layer 43 therethrough, so that an insulating-type substrate with a light-transmitting material is used. Specifically, a glass substrate or a resin film such as polyimide is used. The resin film can be used to make the organic-EL display apparatus flexible, and also allow the organic-EL display apparatus to be pasted onto a curved surface.

While not necessary in a case that the substrate 10 is a glass substrate, a base coat layer 11 is formed on the surface of the substrate 10 since it is difficult to form the semiconductor layer formed of such as silicon in a case that the substrate 10 is a resin film such as polyimide. As the base coat layer 11, a deposited body of $SiO_2$ (silicon oxide) having a thickness of approximately 500 nm, $SiN_x$ (silicon nitride) having a thickness of approximately 50 nm, and $SiO_2$ having a thickness of 250 nm is formed using plasma CVD, for example.

A drive circuit comprising the TFT 20 is formed on a surface of the base coat layer 11. While only the cathode wiring 27 is shown in FIGS. 1A to 1C, other wirings such as the gate wiring and signal wiring are also formed in the same manner. While only the TFT 20 to drive the OLED 40 is shown in FIGS. 1A to 1C, the other TFTs such as the switching TFT are also formed in the same manner. In a case of the top emission-type organic-EL display apparatus, the above-mentioned drive circuit can be formed over the entire surface below the light-emitting region of the OLED 40.

However, with the bottom emission-type organic-EL display apparatus, the TFT and so forth cannot be formed below the light-emitting region of the OLED 40, so that the TFT and so forth need to be formed in a portion not planarly overlapping the light-emitting region. In this case, an inclined surface is formed in a boundary portion between a region of the peripheral edge of the OLED 40, in which region a TFT or a wiring is formed, and a region below the light-emitting region, in which region a TFT is not formed, causing unevenness to be formed at the peripheral edge of the light-emitting region and display definition to deteriorate. Therefore, the same planarity is required even with the bottom emission-type.

In the structure shown in FIG. 1A, with respect to the TFT 20, the semiconductor layer 21 is formed via the gate insulating layer 22 over the gate electrode 23. The gate electrode 23 is formed by being subjected to patterning after forming such as a Mo layer having a thickness of approximately 250 nm at the same time as the cathode wiring 27 and so forth. The gate insulating layer 22 being provided on the surface of the base coat layer 11 and the gate electrode 23 is formed of $SiO_2$ having a thickness of approximately 50 nm, while the semiconductor layer 21 being provided on the surface of the gate insulating layer 22 is formed to a thickness of approximately 200 nm using a-Si. In the example shown in FIG. 1A, a second semiconductor layer 211 formed of a-Si having a high impurity concentration is formed on a surface of the semiconductor layer 21. The second semiconductor layer 211 is provided to obtain a good electrical connection between the semiconductor layer 21, and the second conductor layer 25*a* making up the source electrode 25 and the first conductor layer 26*a* making up the drain electrode 26. Therefore, without forming the second semiconductor layer 211, the subject region of the semiconductor layer 21 can be made to have a high impurity concentration by such as doping. After forming a conductor layer formed of such as Ti/Ai/Ti on the surface of the entirety of what is described in the above, the conductor layer is subjected to patterning, and thereby, the second conductor layer 25*a* making up the source electrode 25 and the first conductor layer 26*a* making up the drain electrode 26 are formed. As described previously, the first conductor layer 26*a* and the second conductor layer 25*a* are formed such that the first portions 26*a*1, . . . and the second portions 25*a*1, . . . are alternately arranged.

After the contact hole 30*a* is formed such that the below-described planarizing layer 30 and the second conductor layer 25*a* are exposed, the conductor layer 410 being filled at the interior of the contact hole 30*a* is formed, and thereby, the second conductor layer 25*a* making up the source electrode 25 is connected to the first electrode 41 of the organic light-emitting element 40 via the conductor layer 410. The first conductor layer 26*a* making up the drain electrode 26 is connected to a drive circuit being not shown.

In the example shown in FIG. 1B, first, the first conductor layer 26*a* and the second conductor layer 25*a* are formed on the surface of the base coat layer 11, the semiconductor layer 21 is formed on the surface of the first conductor layer 26*a*, the second conductor layer 25*a*, and the base coat layer 11, the gate insulating layer 22 are formed on the surface of the semiconductor layer 21, the gate electrode 23 is formed on the surface of the gate insulating layer 22 and thereby, the TFT 20 is formed.

While the example shown in FIG. 1C has the same structure as the structure of the TFT using LTPS, the TFT using a-Si can also be made to have the same structure. In other words, the semiconductor layer 21 formed of a-Si is formed on the base coat layer 11, a source 21s and a drain 21d are formed by portions being doped with a high concentration to be connected to the source electrode 25 and the drain electrode 26, respectively, and the channel 21c being doped with a low concentration is formed therebetween. The gate insulating layer 22 and the gate electrode 23 are formed thereon, and an interlayer insulating layer 24 formed of an $SiO_2$ layer having a thickness of approximately 300 nm and an $SiN_x$ layer having a thickness of approximately 300 nm is formed thereon. The second conductor layer 25a being connected to the source 21s and to be made the source electrode 25, and the first conductor layer 26a being connected to the drain 21d and to be made the drain electrode 26 are formed with a conductor layer being filled into a contact hole 24a via the above-mentioned interlayer insulating layer 24. Before the interlayer insulating layer 24 is formed, B (boron) ions, are doped into an electrode connecting portion of the source 21s and the drain 21d to be $p^+$ charged and the dopant is activated by annealing.

The planarizing layer 30, in which the inorganic insulating layer 31 formed of $SiN_x$ having a thickness of approximately 200 nm as a barrier layer, and the organic insulating layer 32 formed of polyimide or an acrylic resin, for example, are formed to a thickness of approximately 2 μm on the surface of the drive circuit comprising the TFT 20. The contact hole 30a is formed in the above-mentioned planarizing layer 30 and the conductor layer 410 is formed therein. The above-mentioned contact hole 30a can be collectively formed in the inorganic insulating layer 31 and the organic insulating layer 32, or, as described bellow, after a first contact hole 30a1 is formed in the inorganic insulating layer 31, the photosensitive organic insulating layer 32 is formed, exposed, and developed, and thereby, the second contact hole 30a2 is formed such that it is overlapped thereonto, causing the first contact hole 30a1 and the second contact hole 30a2 to be made as the contact hole 30a. As described later, the organic insulating layer 32 is planarized using CMP polishing such that the surface thereof is brought to 50 nm or less in arithmetic average roughness Ra. Moreover, as described below, it is preferable that the arithmetic, average roughness Ra be 20 nm or more.

The conductor layer 410 is formed of a Ti layer 411 having a thickness of approximately between 25 nm and 100 nm, and a Cu layer 41 having a thickness of approximately between 1000 nm and 2000 nm. The Ti layer 411 is formed on the entire surface thereof using sputtering, so that it is formed without any gaps even when there are stepped portions in the contact hole 30a. The Cu layer 412 is formed by electroplating with the Ti layer 411 as a current supplying layer (seed layer). Thus, the conductor layer 410 having a low resistance is continuously formed in a seamless manner even when there are stepped portions in the contact hole 30a. Cu to make up the Cu layer 412 can be Cu alloy having the above-described composition, for example. A second contact 45 to connect the second electrode (cathode) of the organic-EL display apparatus to the cathode wiring 27 is also formed in the same manner with the Ti layer 411 and the Cu layer 412.

An Ag layer 413 is formed to a thickness of approximately 100 nm using such as sputtering, on the surface of the above-mentioned planarizing layer and the conductor layer 410 being filled at the interior of the contact hole 30a, and further, an ITO layer 414 is formed on the surface of the Ag layer 413, and then, it is subjected to patterning using a photolithography process, and thereby, the first electrode (anode) 41 of the OLED 40 is formed. The above-mentioned Ag fits very well with Cu or Cu alloy of the conductor layer 410 and joins well, making it possible to reduce the contact resistance therebetween. Therefore, the resistance between the TFT 20 and the OLED 40 is also reduced, making it possible to reduce consumed power of the organic-EL display apparatus. Moreover, since Ag has large light reflectance, light emitted by the OLED 40 is reflected on a surface facing to the substrate 10, making it possible to provide a display apparatus having a large luminance as that of the top emission type. Ag making up the Ag layer 413 can be APC, allowing to obtain the same effects as Ag described in the above. Moreover, ITO making up the ITO layer 413 is light-transmitting material having a work function of approximately 5 eV, makes it possible to improve an injectability of positive holes in relation to the organic light-emitting layer 43. Therefore, the ITO layer having a thickness of approximately 10 nm is formed by depositing on the surface of the first electrode 41 being formed of Ag or APC. In a case of the bottom emission-type, with respect to the first electrode 41, the ITO layer is formed to a thickness of approximately between 300 nm and 1 μm. An insulating bank 42 formed of an insulating material to achieve insulation between the first electrode 41 and the second electrode 44 as well as to partition the individual pixels is formed at the peripheral edge of the above-mentioned first electrode 41, and the organic light-emitting layer 43 is deposited over the first electrode 41 being surrounded by the above-mentioned insulating bank 42.

The organic light-emitting layer 43 is deposited over the first electrode 41 being surrounded by the insulating bank 42 and exposed. While the organic light-emitting layer 43 is shown as one layer in FIGS. 1A to 1C, it can be formed as a plurality of layers with various materials being deposited thereon. Moreover, the above-mentioned organic light-emitting layer 43 is susceptible to moisture and cannot be subjected to patterning after forming it on the entire surface, so that it is formed by selectively vapor depositing evaporated or sublimed organic materials only onto a required portion using a vapor-deposition mask. Alternatively, the organic light-emitting layer 43 can be formed by printing.

Specifically, as a layer to be in contact with the first electrode (anode electrode) 41, for example, a positive hole injection layer, being formed of a material having a high compatibility with ionization energy, can be provided to improve an injectability of positive holes. A positive hole transport layer is formed by an amine-based material, for example, on the above-mentioned positive hole injection layer to allow trapping of electrons into the light-emitting layer (energy barrier) as well as improving the stable transport of positive holes. Moreover, the light-emitting layer is formed thereon/thereover by an organic luminescence material of red or green being doped to $Alq_3$ (tris (8-hydroxyquinolinato) aluminum) for red or green, for example, to be selected in accordance with the light-emitting wavelength. Moreover, as a blue-color material, a DSA(distyrylarylene)-based organic material is used. On the other hand, in a case that coloring is carried out using a color filter being not shown, all of the light-emitting layer can be formed by the same material without doping thereto. An electron transport layer is formed by such as $Alq_3$ on/over the light-emitting layer to stably transport electrons as well as to further improve an injectability of electrons. These individual layers, each having a thickness of approximately several tens of nm, are deposited, and thereby, deposited layers of organic light-emitting layer 43 are formed. An electron injection layer such as LiF (lithium fluoride) or Liq (8-hydroxyquinolinato lithium) can be also provided between the above-mentioned organic light-emitting layer 43 and the second electrode 44 to improve an injectability of electrons. While this is not an organic layer, it is categorized herein into the organic light-emitting layer 43 as it emits light by an organic layer.

As described previously, of deposited layers in the organic light-emitting layer 43, the light-emitting layer can be made into a color display apparatus using a color filter without organic materials according to each color of R, G, and B being deposited. In other words, the light-emitting layer can be formed with the same organic material and a light emission color can be specified using a color filter being not shown. Moreover, regarding the light-emitting performance as important, it is preferable that the positive hole transport layer and the electron transport layer be separately deposited using a material suitable for the light-emitting layer. However, taking account of the aspect of material cost, they can be deposited using the same material being common to two or three colors of R, G, and B.

After all of the deposited layers, comprising the electron injection layer such as a UP layer, of the organic light-emitting layer 43, are formed, the second electrode 44 is formed on the surface thereof. Specifically, the second electrode (cathode) 44 is formed over the organic light-emitting layer 43. The second electrode 44 is continuously formed in common across all of the pixels. Moreover, the second electrode 44 is connected to the cathode wiring 27 via the second contact 45 being formed in the planarizing layer 30 and the first contact 28 being formed in the insulating layer 22, 24 of the TFT 20. Furthermore, the second electrode 44 is connected to the cathode wiring 27 via a second contact 45 being formed in the planarizing layer 30. In the example in FIG. 1C, the first contact 28 being formed in the insulating layer 22, 24 of the TFT 20 is interposed between the second contact 45 and the cathode wiring 27. Since the second electrode 44 is formed of a light-transmitting material, for example, a thin-film Mg—Ag (magnesium-silver alloy) eutectic layer, and is susceptible to corrosion due to moisture, it is coated by a coating layer 46 being provided on the surface thereof. A cathode material is preferably a material having a small work function, so that an alkaline metal or an alkaline earth metal can be used. While Mg (magnesium) having a small work function of 3.6 eV is preferable, it is active and unstable, so that Ag having a work function of 4.25 eV is co-vapor deposited at the ratio of approximately 10 mass %. Al (aluminum) also having a small work function of approximately 4.5 eV can be used adequately by LiF being used for the base. Therefore, with the bottom emission-type, Al can be formed thickly into the above-mentioned second electrode 44.

The coating layer 46 is formed of an inorganic insulating layer such as $SiN_x$ or $SiO_2$, for example, or an organic insulating layer such as TEE (tetrafluoroethylene), and can be formed with a single layer or two or more layers of deposited layer. For example, it is preferable that the coating layer 46 be formed with approximately two layers of deposited layer having a thickness of approximately between 0.1 μm and 0.5 μm per one layer, for example. The above-mentioned coating layer 46 is preferably formed in a multilayer with different materials. With the coating layer 46 being formed in the multilayer, pin holes seldom match in the multilayer completely even when a pin hole is created, allowing it to be completely shielded from outer air. As described previously, the above-mentioned coating layer 46 is formed such as to completely coat the organic light-emitting layer 43 and the second electrode 44. The coating layer 46 can comprise an organic insulating layer in between two layers of inorganic insulating layer.

MANUFACTURING METHOD OF ORGANIC-EL DISPLAY APPARATUS

Example 1

Next, a manufacturing method of the organic-EL display apparatus shown in FIG. 1A is explained with reference to flowcharts in FIGS. 4A and 4B and views of the manufacturing process in FIGS. 5A to 5G.

Figure 4A:
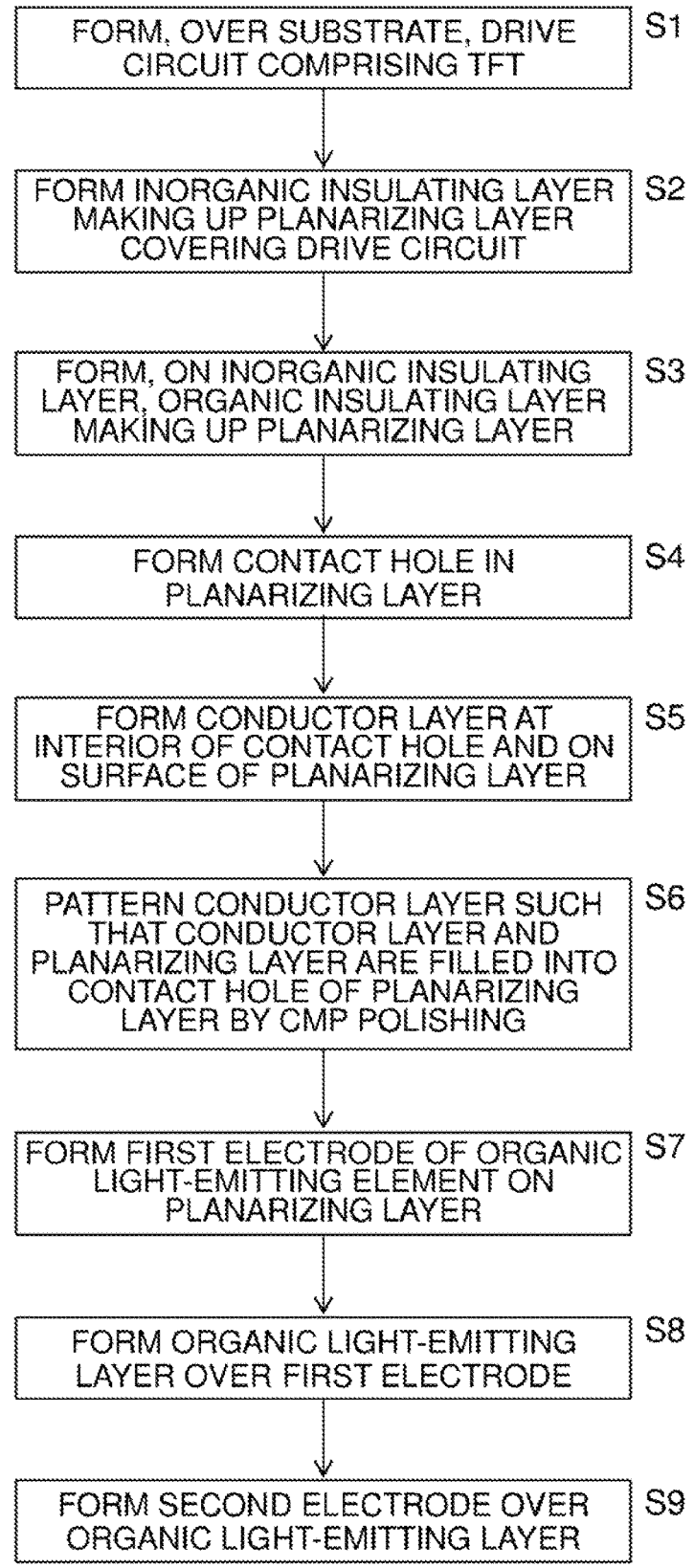
FIG. 4A shows a flowchart of a manufacturing process of the organic-EL display apparatus according to Example 1 in FIG. 1A.
Figure 4B:
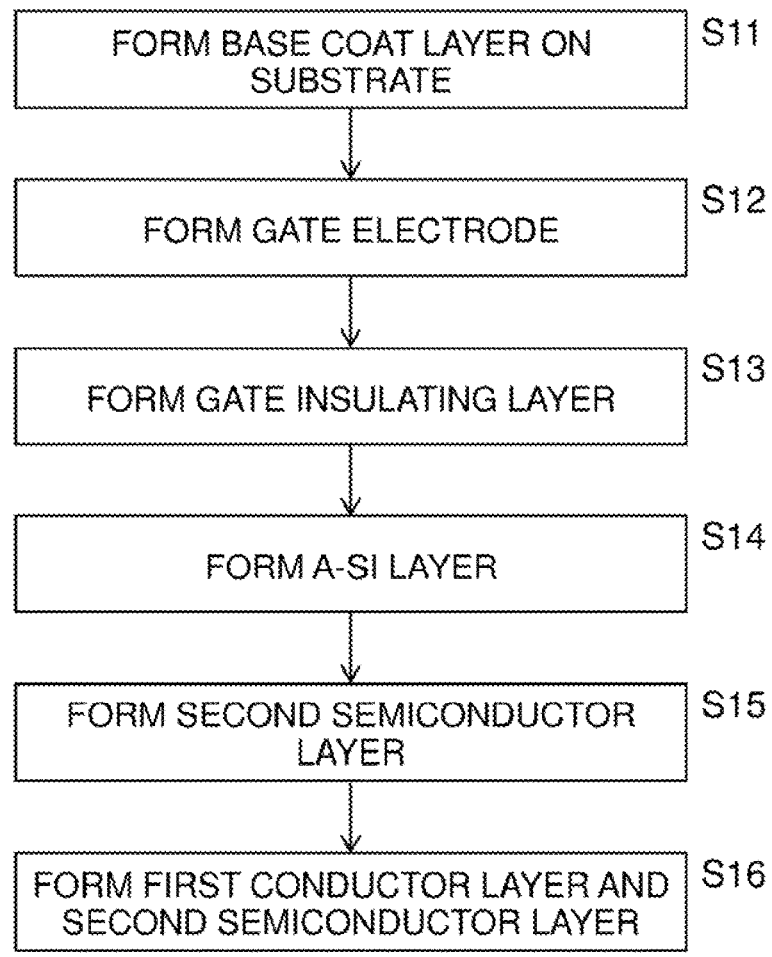
FIG. 4B shows a flowchart to explain, in further detail, the process being in FIG. 4A.
Figure 5A:
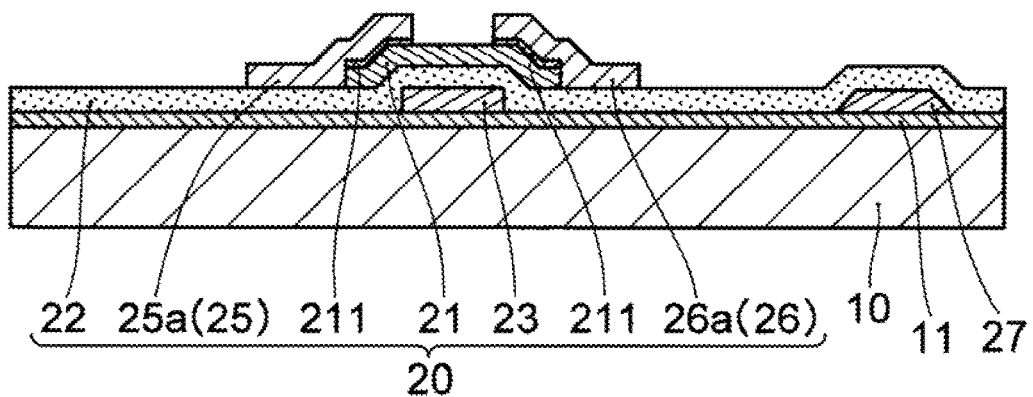
FIG. 5A shows a cross-sectional view of the manufacturing process of the organic-EL display apparatus according to Example 1 in FIG. 1A.

First, as shown in the flowchart in FIG. 4A, and in FIG. 5A, a drive circuit comprising a TFT 20 is formed over a substrate 10 (Si in FIG. 4A). Specifically, as shown in the flowchart in FIG. 4B, a base coat layer 11 is formed on the substrate 10. The base coat layer 11 is formed by forming an $SiO_2$ layer to a thickness of approximately 500 nm, forming thereon an. $SiN_x$ layer to a thickness of approximately 50 nm to deposit an underlayer, and depositing further thereon an $SiO_2$ layer to a thickness of approximately 250 nm as an overlayer thereof, using plasma CVD, for example (S11 in FIG. 4B).

Thereafter, wirings such as a gate electrode 23, a cathode wiring 27, and the other gate wiring and signal wiring are formed on a surface of the base coat layer 11 by forming a metal layer such as Mo using such as sputtering, and patterning (S12).

Thereafter, a gate insulating layer 22 is formed on the surface of the entirety of what is described in the above (S13). The gate insulating layer 22 is formed by forming an $SiO_2$ layer to a thickness of approximately 50 nm using plasma CVD.

Thereafter, a semiconductor layer 21 formed of a-Si is formed on a surface of the gate insulating layer 22 using plasma CVD (S14). A dehydrogenation process on the above-mentioned semiconductor layer 21 is carried out by annealing for approximately 45 minutes under the temperature of approximately 350° C., for example.

Thereafter, a second semiconductor layer 211 formed of Si having a high impurity concentration is formed to a thickness of approximately 10 nm, on the surface of the semiconductor layer 21, in portions to be connected with a second conductor layer 25a making up a source electrode 25 and a first conductor layer 26a making up a drain electrode 26 (S15). Without forming the second semiconductor layer, impurities can be doped in a portion in which the second conductor layer 25a and the first conductor layer 26a of the semiconductor layer 21 are connected.

The first conductor layer 26a and the second conductor layer 25a are formed by a conductor layer being formed to a thickness of approximately between 200 nm and 800 nm using a method such as sputtering and then being subjected to patterning (S16). Using sputtering followed by patterning, each of the first conductor layer 26a and the second conductor layer 25a are formed in a planar shape as shown in FIG. 2A, for example, by depositing approximately 300 nm of Ti layer and approximately 300 nm of Al layer and depositing approximately 100 nm of Ti thereon. Then, the second semiconductor layer 211 being sandwiched between the first conductor layer 26a and the second conductor layer 25a is removed by etching.

A drive circuit comprising the TFT 20, or, in other words, a portion called a back plane is formed according to the above-described process.

Figure 5B:
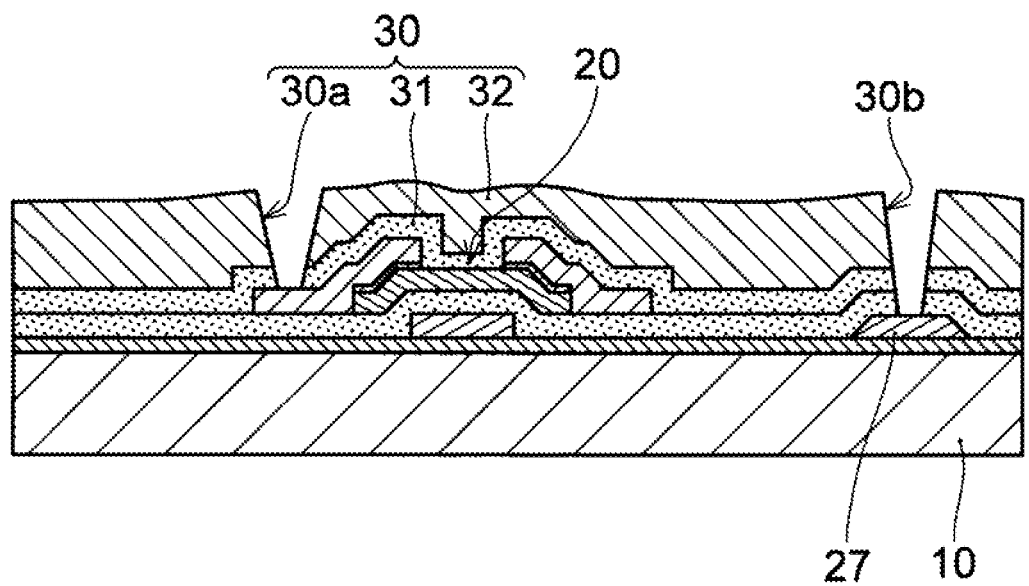
FIG. 5B shows a cross-sectional view of the manufacturing process of the organic-EL display apparatus according to Example 1 in FIG. 1A.

Thereafter, as shown in FIG. 5B, an inorganic insulating layer 31 is formed on a surface of the drive circuit. (S2 back in FIG. 4A). With respect to the inorganic insulating layer 31, $SiN_x$ is formed to a thickness of approximately 200 nm using plasma CVD, for example. This functions as a barrier layer to prevent a component of the organic insulating layer 32 from penetrating toward the TFT 20. Then, an organic insulating layer 32 is formed on a surface of the inorganic insulating layer 31 (S3). The organic insulating layer 32 is to be filled in a portion having unevenness on the surface due to forming of the TFT 20, and a surface of the organic insulating layer 32 can be easily planarized by applying a liquid resin. While slit coating or spin coating can be a method of applying, slit and spin coating, in which both thereof, are combined is preferable. The above-mentioned organic insulating layer 32 is formed to a thickness of approximately 2 μm, and a polyimide resin or an acrylic resin can be used therefor, for example. A photosensitive resin in which a photopolymerization initiator is mixed into the above-mentioned resin can also be used therefor. The above-mentioned example will be described below. However, a non-photosensitive resin not comprising the photopolymerization initiator is preferable in that it is high in purity and, even more, the surface smoothness is high. In particular, the acrylic resin is preferable in that it is inexpensive. A planarizing layer 30 is configured by the inorganic insulating layer 31 and the organic insulating layer 32 as described above.

Thereafter, a contact hole 30a to reach the TFT 20 is formed in the above-mentioned planarizing layer 30 (S4). Forming of the above-mentioned contact hole 30a is carried out by etching such as dry etching by forming a resist mask in the same manner as the previously-described contact hole 24a. Collectively etching a layer comprising both the inorganic insulating layer 31 and the organic insulating layer 32, such as the above-mentioned planarizing layer 30, is preferable in that stepped portions are unlikely to be formed at the interface of the two layers by carrying out etching using dry etching, since the etching rate differs between the two layers. There is a problem that the stepped portions being produced causes a metal to be filled into the contact hole 30a not to be completely filled thereinto, making it likely for the contact resistance with such as the source electrode 25 to increase. However, according to the present Embodiment, even with the stepped portions, the metal can be sufficiently filled by electroplating using the Ti layer 411 as a mere thin layer. At this time, a contact hole 30b for forming a second contact 45 to connect to the cathode wiring 27 is also formed in the same manner.

Figure 5C:
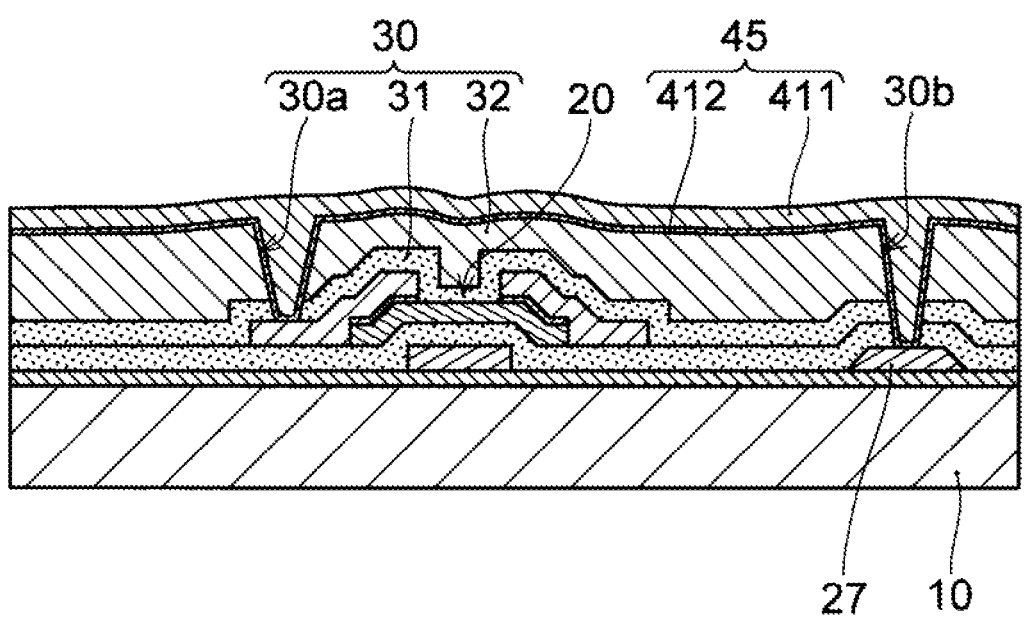
FIG. 5C shows a cross-sectional view of the manufacturing process of the organic-EL display apparatus according to Example 1 in FIG. 1A.

Next, as shown in FIG. 5C, a conductor layer 410 comprising the Ti layer 411 and a Cu layer 412 is formed on the surface of the organic insulating layer 32 and at the interior of the contact hole 30a (S5). Specifically, the Ti layer 411 is formed to the previously-described thickness using such as sputtering, and thereafter, the Cu layer 412 is formed by electroplating using the Ti layer 411 as a current supplying layer (seed layer). As described above, Cu making up the Cu layer 412 can be replaced with a Cu alloy.

Figure 5D:
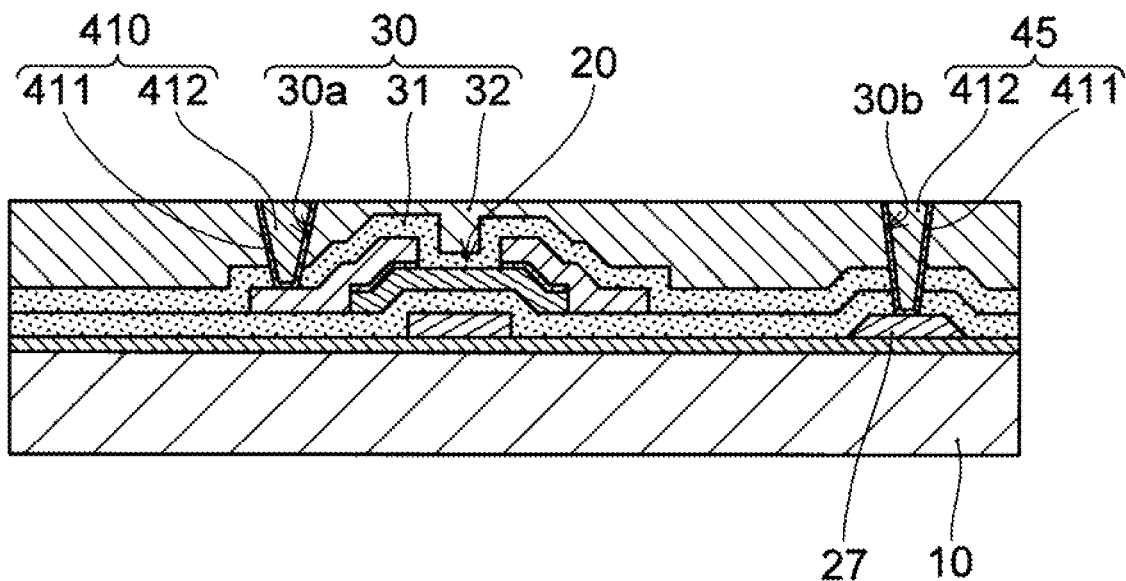
FIG. 5D shows a cross-sectional view of the manufacturing process of the organic-EL display apparatus according to Example 1 in FIG. 1A.

Thereafter, as shown in FIG. 5D, the conductor layer 410 on the surface of the organic insulating layer 32 is removed by polishing, and further, the surface of the organic insulating layer 32 is planarized by CMP polishing (S6). Since Cu or a Cu alloy is chemically stable, it is difficult to be subjected to etching. Therefore, the conductor layer, being formed on the surface of the organic insulating layer 32, is removed by mechanical polishing. As a result, the surface of the contact layer 410, the contact layer 410 being filled into the contact hole 30a, and the surface of the organic insulating layer 32 are almost flush with each other, and the surface of the organic insulating layer 32 is planar zed when viewed microscopically.

Polishing of the above-mentioned conductor layer 410 is carried out by polishing using a polishing slurry in which a polishing agent formed of fine particles such as cerium oxide ($CeO_2$), silica ($SiO_2$), or alumina ($Al_2O_3$), and a pH adjusting agent are mixed into water or alcohol, causing the conductor layer 410 on the organic insulating layer 32 to be removed. For the use of silica, a fumed silica, which is made by $SiCl_4$ (silicon tetrachloride) as a raw material being oxidized and dechlorinated in the flame, is preferably used. As shown in FIG. 3D, carrying out CMP polishing using such a polishing slurry causes the planarized surface in which the surface roughness is 50 nm or less in arithmetic average roughness Ra to be formed. At this time, the second contact 45 for connecting the cathode (the second electrode) of the organic-EL display apparatus to the cathode wiring 27 is also formed in the same manner with the Ti layer 411 and the Cu layer 412.

In other words, the surface of the organic insulating layer 32 is likely to be planarized, since a liquid resin is applied thereon and dried using a method such as slip and spin, so that, as described previously, the above-mentioned surface is formed to approximately between 100 and 300 nm in arithmetic average roughness Ra. However, the present inventors have found that, as described previously, the planarity as a result of only applying on the organic insulating layer 32 causes color non-uniformity and/or luminance non-uniformity to appear, causing it not possible to sufficiently satisfy the light-emitting characteristics. Therefore, using CMP polishing, the above-mentioned surface is polished such that the planarity thereof is brought to be 50 nm or less in arithmetic average roughness Ra. While the smaller the above-mentioned planarity the more preferable, it is not required to have such an extreme planarity as being 20 nm or less as disclosed in Patent document 1. The planarity of 50 nm or less does not cause such problematic color non-uniformity and/or luminance non-uniformity to appear. As described previously, while it is preferable to carry out polishing of the organic insulating layer 32 using mechanical polishing since the Cu layer 412 is chemically stable, it is more preferable to carry out the polishing of the organic insulating layer 32 by CMP using the above-described polishing agent. Moreover, while the lower limit is not to be set as the smaller the surface roughness the more preferable, the polishing work will be cumbersome, so that it is preferable to be brought to the surface roughness of 20 nm or more, and 50 nm or less.

Figure 5E:
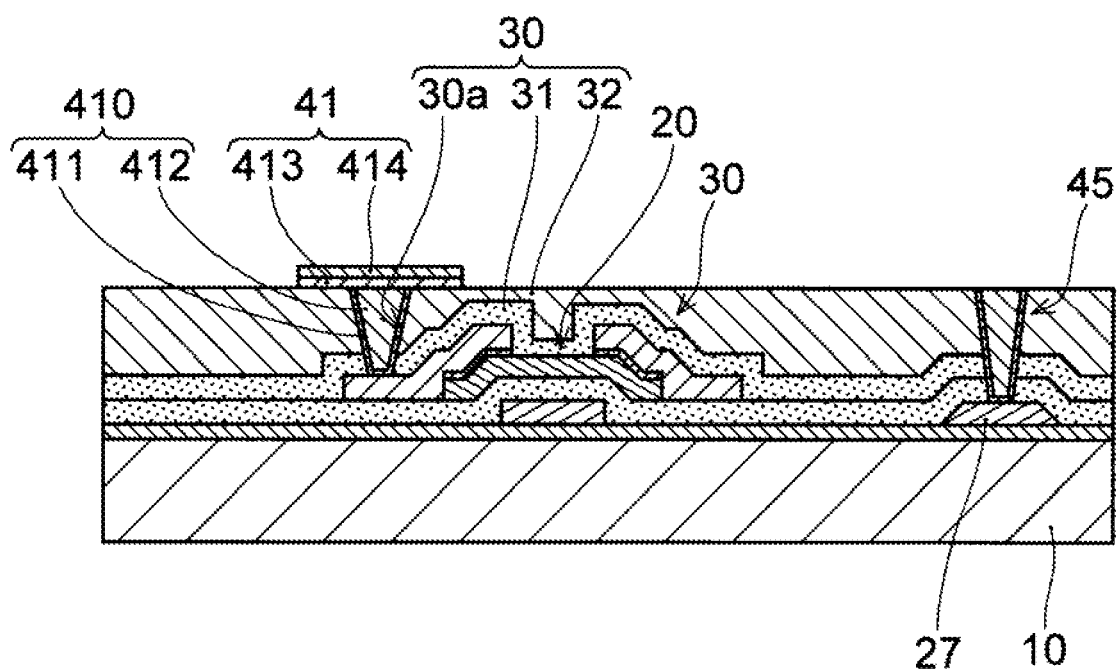
FIG. 5E shows a cross-sectional view of the manufacturing process of the organic-EL display apparatus according to Example 1 in FIG. 1A.

Thereafter, as shown in FIG. 5E, a first electrode 41 of an OLED 40 is formed on the surface of the organic insulating layer 32 such as to be connected to the conductor layer 410 being formed at the interior of the contact hole 30a (S7). Specifically, using such as sputtering, for example, an underlayer in which is deposited an Ag layer 413 having a thickness of approximately 100 nm, and an overlayer being made of an ITO layer 414 having a thickness of approximately 10 nm are formed, and thereafter, a mask is formed by forming of a resist layer and a photolithography process, and carrying out etching such as wet etching, and thereby, the first electrode 41 is formed. As a result, the Ag layer 413 being in close contact to the Cu layer 412 of the conductor layer 410 at the interior of the contact hole 30a is formed, causing the contact resistance between the conductor layer 410 and the first electrode 41 to be reduced. Moreover, the ITO layer 414 is formed on the surface of the Ag layer 413, causing the first electrode 41 being also highly compatible with an organic light-emitting layer 43 to be formed thereon. Ag making up the Ag layer 413 can be replaced with APC.

Figure 5F:
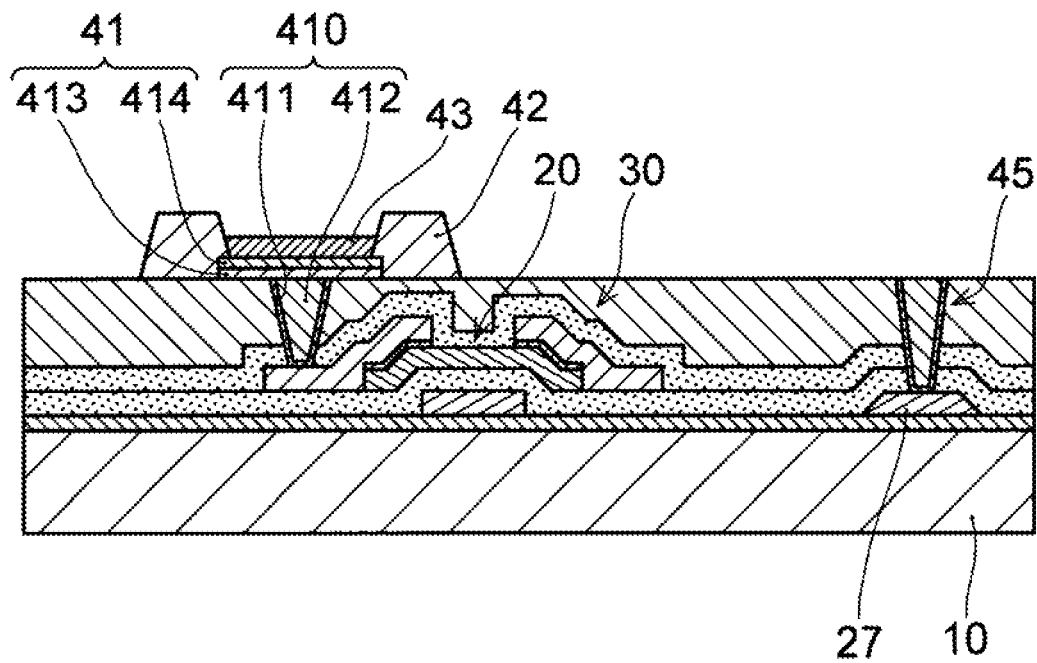
FIG. 5F shows a cross-sectional view of the manufacturing process of the organic-EL display apparatus according to Example 1 in FIG. 1A.

Thereafter, as shown in FIG. 5F, the organic light-emitting layer 43 is formed over the first electrode 41 (S8). Specifically, an insulating bank 42 is formed at the peripheral edge of the first electrode 41 to prevent contact between the cathode and the anode as well as to partition each pixel. The insulating bank 42 can be an inorganic insulating layer such as $SiO_2$, or an organic insulating resin such as a polyimide or acrylic resin, and is formed such that a given location of the first electrode 41 is exposed. The insulating bank 42 is formed to a thickness of approximately 1 μm in height. As described previously, while various organic materials are deposited in the organic light-emitting layer 43, depositing of the organic materials is carried out by vacuum vapor deposition, for example, in which case the organic light-emitting layer 43 is formed via a vapor-deposition mask having an aperture corresponding to a desired sub-pixel, such as R, G, or B through the aperture of the vapor-deposition mask. A layer such as LiF can be formed on the surface of the organic light-emitting layer 43 to improve an injectability of electrons. The organic light-emitting layer 43 can also be formed by printing such as an inkjet method, not vapor deposition. The reason why Ag is used for the first electrode 41 is for use as the top emission-type causing light emitted by the organic light-emitting layer 43 to be reflected.

Figure 5G:
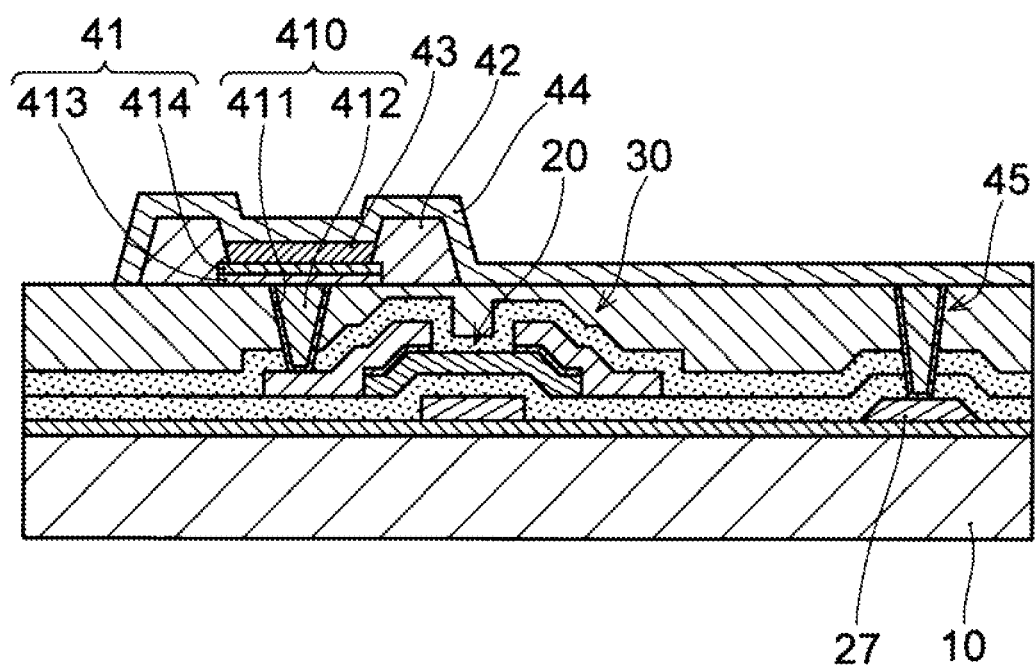
FIG. 5G shows a cross-sectional view of the manufacturing process of the organic-EL display apparatus according to Example 1 in FIG. 1A.

Thereafter, as shown in FIG. 5G, a second electrode (a cathode) 44 is formed over the organic light-emitting layer 43 (S9). The second electrode 44 is made to be a cathode by forming a thin film of Mg—Ag eutectic layer on the entire surface thereover using such as vapor deposition, and subjecting it to patterning. The second electrode 44 is formed also on the second contact 45 to be connected to the cathode wiring 27 via the first contact 28 and the second contact 45. Mg and Ag having different melting points are evaporated from different crucibles to be eutecticized at the time of forming the above-mentioned Mg—Ag eutectic layer. With the Mg—Ag eutectic layer being formed of Mg at approximately 90 mass % and Ag at approximately 10 mass %, the second electrode 44 is formed to the thickness of approximately 10 to 20 nm.

A coating layer 46 to protect the second electrode 44 and the organic light-emitting layer 43 from such as moisture or oxygen is formed over the above-mentioned second electrode 44. The above-mentioned coating layer 46 is formed of an inorganic insulating layer, such as $SiO_2$ or $SiN_x$, being difficult to absorb moisture, by such as plasma CVD, to protect the organic light-emitting layer 43 and the second electrode 44 being susceptible to moisture or oxygen. The above-mentioned coating layer 46 is preferably formed such that the end portion thereof comes into close contact with an inorganic layer such as the inorganic insulating layer 31. This is because, while joining of the inorganic layers together causes them to be joined in close contact with each other, joining in fully close contact is difficult to be obtained in joining with an organic layer. Therefore, it is preferable that a part of the organic insulating layer 32 be removed to cause it to be joined to the inorganic insulating layer 31 being an underlayer thereof. This makes it possible to completely prevent penetration of moisture.

The organic-EL display apparatus shown in FIG. 1A is manufactured by undergoing the above-described process. In the present Example, the above-described polishing is carried out also on the surface of the conductor layer 410 being a joint portion with the first electrode 41, the conductor layer 410 being filled at the interior of the contact hole 30a, and thereby, the surface roughness thereof is brought to 50 nm or less. Therefore, even in a case that the organic light-emitting layer 43 is formed in a region being overlapped in planar view onto the conductor layer 410 and the contact hole 30a, display non-uniformity cannot be produced. Therefore, organic light-emitting elements can be arranged in a pitch smaller than that in a conventional case, even when the organic-EL display apparatus is to be installed in a mobile apparatus and has a small size with little space for forming a drive circuit.

Example 2

Figure 6A:
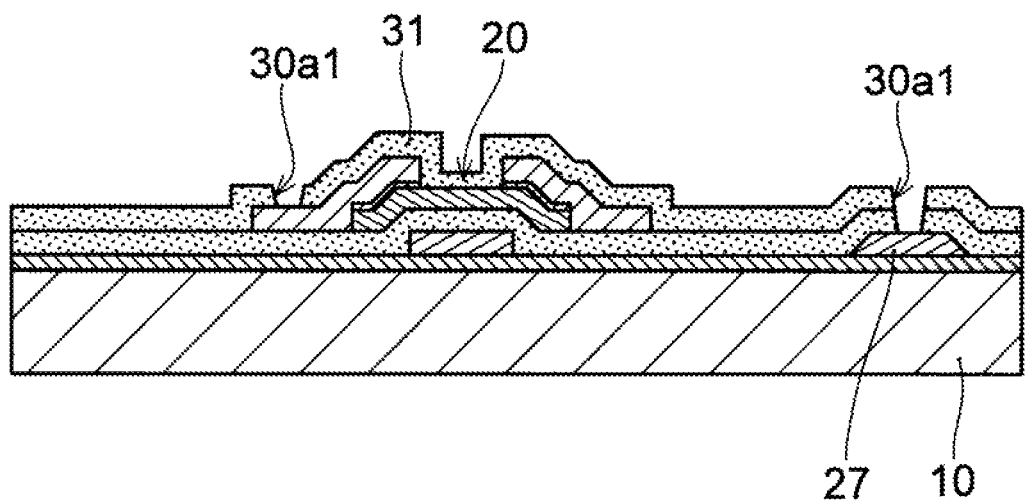
FIG. 6A shows a cross-sectional view of the manufacturing process of the organic-EL display apparatus according to Example 2 in FIG. 1A.

In the manufacturing method of according to Example 1 being shown in FIGS. 4A and 4B, and FIGS. 5A to 5G, while the inorganic insulating layer 31 and the organic insulating layer 32 are continuously formed and the contact hole 30a is collectively formed with respect to the planarizing layer 30, as the organic insulating layer 32, the organic insulating layer 32 comprising a photosensitive organic material comprising a photopolymerization initiator can be formed, the inorganic insulating layer 31 can be formed, and then, the first contact hole 30a1 can be formed, and thereafter, the organic insulating layer 32 having a photosensitivity can be formed, and the second contact hole 30a2 can be formed by exposure and development to be made as the contact hole 30a. The above-described example is shown in FIGS. 6A and 6B.

Specifically, the process shown in FIG. 5A as described previously is carried out in the same manner as in Example 1. Thereafter, as shown in FIG. 6A, after the inorganic insulating layer 31 is formed, the first contact hole 30a1 is formed at a location where the contact hole 30a is formed. In the same manner as forming the previously-described contact hole 30a, after forming a resist layer, an aperture is formed in the resist layer using a photolithography process, and the above-mentioned first contact hole 30a1 is formed by carrying out etching using such as dry etching with the above-mentioned resist layer as a mask. While forming a photosensitive organic insulating layer makes it easy to form the second contact hole 30a2, the effect of leveling of the organic insulating layer is reduced due to adding the photopolymerization initiator, causing the surface roughness to increase. However, no problem occurs since the above-mentioned surface is CMP polished.

Figure 6B:
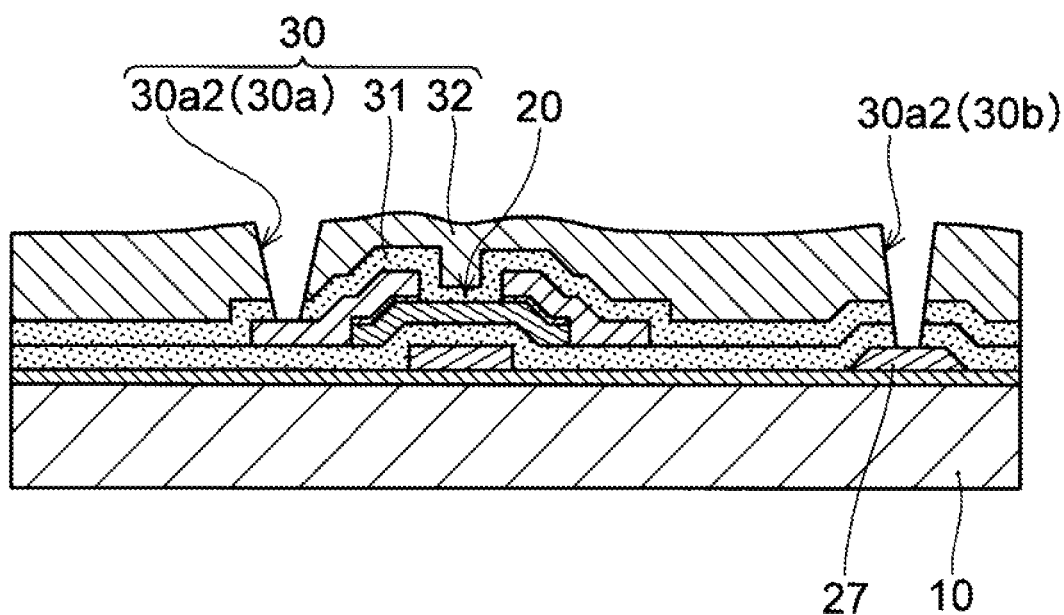
FIG. 6B shows a cross-sectional view of the manufacturing process of the organic-EL display apparatus according to Example 2 in FIG. 1A.

Thereafter, as shown in FIG. 6B, the organic insulating layer 32 is formed and the second contact hole 30a2 is formed by exposure and development at the position of the first contact hole 30a1 of the inorganic insulating layer 31. As a result, the second contact hole 30a2 is continuously formed with the first contact hole 30a1, to be made to the contact hole 30a, 30b. This results in the same structure as that shown in FIG. 5B, and the subsequent process will be the same as that in Example 1. Therefore, repeated explanations will be omitted. Also in the present Example, polishing is carried out on the surface of the conductor layer 410 being a joint portion with the first electrode 41, the conductor layer 410 being filled at the interior of the contact hole 30a, and thereby, the surface roughness thereof is brought to 50 nm or less, so that even in a case of forming the organic light-emitting layer 43 in a region overlapping in planar view onto the conductor layer 410 and the contact hole 30a, display non-uniformity cannot be formed. Therefore, organic light-emitting elements can be arranged in a pitch smaller than that in a conventional case, even when the organic-EL display apparatus is to be installed in a mobile apparatus and has a small size with little space for forming a drive circuit.

Summary

An organic-EL display apparatus according to Aspect 1 of the present invention comprises a substrate comprising a surface on which is formed a drive circuit comprising a thin-film transistor; a planarizing layer to planarize the surface of the substrate by covering the drive circuit; and an organic light-emitting element comprising a first electrode formed on a surface of the planarizing layer and connected to the drive circuit; an organic light-emitting layer formed over the first electrode, and a second electrode formed over the organic light-emitting layer, wherein the thin-film transistor comprises a gate electrode, a drain electrode, a source electrode, and a semiconductor layer comprising a region to be a channel of the thin-film transistor and extending along a given direction; a first conductor layer comprising the drain electrode and a second conductor layer comprising the source electrode are arranged such that a part of each of the first conductor layer and the second conductor layer is alternately lined up in the given direction; the channel is the semiconductor layer sandwiched between a part of the first conductor layer and a part of the second conductor layer neighboring each other; connecting the drive circuit and the first electrode is carried out via a conductor layer filled at an interior of a contact hole formed in the planarizing layer and the conductor layer comprises a titanium layer and a copper layer or a copper alloy layer; and a surface of the planarizing layer is formed so that arithmetic average roughness Ra is 50 nm or less.

According to the configuration according to Aspect 1 of the present invention, while W/L of the thin-film transistor increases, causing the thin-film transistor having a high current drive capability to be obtained, unevenness having a complex shape reflecting the shape of the first conductor layer and the second conductor layer is formed on a surface of the drive circuit comprising the thin-film transistor. However, the planarizing layer having a surface of 50 nm or less in arithmetic average roughness Ra is formed, so that unevenness of the base of the organic light-emitting element is eliminated even microscopically. This results in suppressing light travelling in slanted directions microscopically and suppressing an occurrence of color non-uniformity and/or luminance non-uniformity, making it possible to substantially improve the display definition of the organic-EL display apparatus. Moreover, a conductor layer comprising the copper layer or the copper alloy layer is filled into the contact hole formed in the planarizing layer, making it possible to finely form copper or copper alloy being difficult to be subjected to etching. This makes it possible to connect the thin-film transistor and the organic light-emitting element via the copper layer or the copper alloy layer, allowing consumed power of the organic-EL display apparatus to be reduced.

In the organic-EL display apparatus according to Aspect 2 of the present invention, a surface of the conductor layer fined at the interior of the contact hole can be formed to the arithmetic average roughness Ra by polishing.

The configuration according to Aspect 2 of the present invention makes it possible to easily and conveniently obtain the conductor layer being filled and a desired arithmetic average roughness Ra thereof.

In the organic-EL display apparatus according to Aspect 3 of the present invention, in Aspect 1 or 2, the first electrode can comprise a silver layer or an APC layer, and an ITO layer.

The configuration according to Aspect 3 of the present invention allows the contact resistance between the conductor and first electrode to be reduced. This allows the consumed power of the organic-EL display apparatus to be reduced.

In the organic-EL display apparatus according to Aspect 4 of the present invention, in Aspect 3, the silver layer or the APC layer can be connected to the copper layer or the copper alloy layer; and the layer can be formed at an interface with the organic light-emitting layer.

The configuration according to Aspect 4 of the present invention allows the silver layer or the APC layer to be connected to the copper layer or the copper alloy layer, making it possible to reduce the contact resistance between the conductor and the first electrode. This allows the consumed power of the organic-EL display apparatus to be reduced. Moreover, the ITO layer is formed at an interface with the organic light-emitting layer, allowing it to be a first electrode being highly compatible with also the organic light-emitting layer.

According to the organic-EL display apparatus according to Aspect 5 of the present invention, in one Aspect of Aspect 1 to 4, each of the first conductor layer and the second conductor layer can be formed in a comb shape in planar view and comb tooth portions of each of the first conductor layer and the second conductor layer can be formed such that the comb tooth portions of the first conductor layer engage with the comb tooth portions of the second conductor layer.

The configuration according to Aspect 5 of the present invention allows a further increase in W/L of the thin-film transistor, making it possible to obtain a thin-film transistor having an even higher current drive capability.

In the organic-EL display apparatus according to Aspect 6 of the present invention, in Aspect 5, a light-emitting region of the light-emitting element can be formed in a rectangular shape and the thin-film transistor can be formed in an underlayer of the light-emitting region, and a portion in which a part of the first conductor layer and a part of the second conductor layer face each other can be thrilled along a long side of the rectangular shape.

The organic-EL display apparatus according to Aspect 6 of the present invention allows to easily arrange the first conductor layer and the second conductor layer to be aligned to the rectangular shape in a limited occupied area of the semiconductor layer, making it possible to efficiently form the thin-film transistor having a large W/L. Moreover, the thin-film transistor can be arranged to three-dimensionally overlap onto the organic light-emitting element, making it possible to form pixels into a small size. This makes it possible to manufacture the organic-EL display apparatus into a small size.

In the organic-EL display apparatus according to Aspect 7 of the present invention, in any one Aspect of Aspects 1 to 6, the semiconductor layer comprises a plurality of regions each one of which is the region to be a channel being sandwiched between the part of the first conductor layer and the part of the second conductor layer being neighboring each other, the semiconductor layer is made of amorphous silicon, and W/L is 50 or more and 500 or less, wherein the W denotes a sum of lengths of facing portions in the plurality of regions, each of the facing portions being a portion at which the part of the first conductor layer and the part of the second conductor layer neighboring each other face each other, and the L denotes an interval between the first conductor layer and the second conductor layer at the facing portion.

The configuration according to Aspect 7 of the present invention makes it possible to obtain the thin-film transistor having a current drive capability being sufficient to drive the organic light-emitting element with current.

A manufacturing method of an organic-EL display apparatus according to Aspect 8 of the present invention comprises: forming, over a substrate, a drive circuit comprising a thin-film transistor; forming an inorganic insulating layer and an organic insulating layer on a surface of the drive circuit; forming, in the organic insulating layer and the inorganic insulating layer, a contact hole to reach the thin-film transistor; forming a conductor layer by forming a titanium layer and a copper layer or a copper alloy layer on a surface of the organic insulating layer and at the interior of the contact hole; planarizing the conductor layer of the surface of the organic insulating layer by removing the conductor layer of the surface of the organic insulating layer by polishing and further polishing the surface of the organic insulating layer; forming a first electrode on a surface of the conductor layer; forming an organic light-emitting layer over the first electrode; and forming a second electrode over the organic light-emitting layer, wherein the thin-film transistor is formed by a deposition structure of a gate electrode, a gate insulating layer, semiconductor layer comprising a region to be a channel and extending along a region to be a channel, and a first conductor layer to be a drain electrode and a second conductor layer to be a source electrode formed in connection with the semiconductor layer; the first conductor layer and the second conductor layer are formed such that a part of each of the first conductor layer and the second conductor layer is arranged to alternately line in a given direction; and the channel is the semiconductor layer sandwiched between the part of the first conductor layer and the part of the second conductor layer adjacent to each other.

According to the configuration according to Aspect 8, while an increase in W/L of the thin-film transistor causes the thin-film transistor having a high current drive capability to be obtained, unevenness having a complex shape reflecting the shape of the first conductor layer and the second conductor layer is formed on the surface of the drive circuit comprising the thin-film transistor. However, the base of the organic light-emitting element is polished, so that unevenness of the surface thereof is eliminated even microscopically. This results in suppressing light travelling in slanted directions microscopically and suppressing an occurrence of color non-uniformity and/or luminance non-uniformity, making it possible to substantially improve the display definition of the organic-EL display apparatus. Moreover, the conductor layer comprising the copper layer or the copper alloy layer is filled into the contact hole formed in the planarizing layer, making it possible to finely form copper or copper alloy being difficult to be subjected to etching. This makes it possible to connect the thin-film transistor and the organic light-emitting element via the copper layer or the copper alloy layer, allowing consumed power of the organic-EL display apparatus to be reduced.

According to the manufacturing method of the organic-EL display apparatus according to Aspect 9, in Aspect 8, in forming of the first electrode, after forming a silver layer or an APC layer on a surface of the copper layer or the copper alloy layer, an ITO layer is formed and then patterning is carried out.

According to the configuration according to Aspect 9 of the present invention, the conductor being the Cu layer, and the first electrode and the Ag layer being in close contact allows the contact resistance between the conductor and the first electrode to be reduced. This allows consumed power of the organic-EL display apparatus to be reduced.

In the manufacturing method of the organic-EL display apparatus according to Aspect 10 of the present invention, in Aspect 8 or 9, the semiconductor layer can comprise an amorphous semiconductor and, in between the semiconductor layer, and the first conductor layer and the second conductor layer, a semiconductor layer of a high impurity concentration is interposed.

According to the configuration of Aspect 10 of the present invention, the semiconductor layer having a high impurity concentration allows the contact resistance between the semiconductor layer comprising an amorphous semiconductor, and the first conductor layer and the second conductor layer to be reduced, allowing consumed power of the organic-EL display apparatus to be reduced.

10 Substrate
20 TFT (thin-film transistor)
21 Semiconductor layer
21c Channel
23 Gate electrode
25 Source electrode
25a Second conductor layer
26 Drain electrode
26a First conductor layer
30 Planarizing layer
30a Contact hole
31 Inorganic insulating layer
32 Organic insulating layer
40 OLED (organic light-emitting element)
41 First electrode (anode)
43 Organic light-emitting layer
44 Second electrode (cathode)
410 Conductor layer
413 Ag layer
414 ITO layer

The invention claimed is:

1. An organic-EL display apparatus, comprising:
a substrate comprising a surface on which is formed a drive circuit comprising a thin-film transistor;
a planarizing layer to planarize the surface of the substrate by covering the drive circuit; and
an organic light-emitting element comprising a first electrode formed on a surface of the planarizing layer and connected to the drive circuit; an organic light-emitting layer formed over the first electrode, and a second electrode formed over the organic light-emitting layer, wherein
the thin-film transistor comprises a thin-film transistor for driving the organic light-emitting element, and the thin-film transistor for driving comprises a gate electrode, a drain electrode, a source electrode, and an amorphous semiconductor layer comprising a region to be a channel and extending along a given direction;
a first conductor layer comprising the drain electrode and a second conductor layer comprising the source electrode are arranged such that a part of each of the first conductor layer and the second conductor layer is alternately lined up in the given direction;
the channel is the amorphous semiconductor layer sandwiched between a part of the first conductor layer and a part of the second conductor layer neighboring each other and the channel is formed to overlap almost an entire surface of a light-emitting region of the organic light-emitting element;

connecting the drive circuit and the first electrode is carried out via a conductor layer filled at an interior of a contact hole formed in the planarizing layer and the conductor layer comprises a titanium layer and a copper layer or a copper alloy layer;

the surface of the planarizing layer is formed so that arithmetic average roughness Ra is 20 nm or more, and 50 nm or less;

the first electrode comprises a silver layer or an APC (silver-palladium-copper alloy) layer, and an ITO (Indium-Tin-Oxide) layer;

the silver layer or the APC layer is connected to the copper layer or the copper alloy layer; and the ITO layer is formed between the organic light-emitting layer and the silver layer or the APC layer.

2. The organic-EL display apparatus according to claim 1, wherein a surface of the conductor layer filled at the interior of the contact hole is formed to the arithmetic average roughness Ra by polishing, and the first electrode is formed on the surface of the conductor layer.

3. The organic-EL display apparatus according to claim 1, wherein each of the first conductor layer and the second conductor layer is formed in a comb shape in planar view and comb tooth portions of each of the first conductor layer and the second conductor layer are formed such that the comb tooth portions of the first conductor layer engage with the comb tooth portions of the second conductor layer.

4. The organic-EL display apparatus according to claim 1, wherein the light-emitting region of the organic light-emitting element is formed in a rectangular shape and the thin-film transistor is formed in an underlayer of the light-emitting region, and a portion in which a part of the first conductor layer and a part of the second conductor layer face each other is formed along a long side of the rectangular shape.

5. The organic-EL display apparatus according to claim 1, wherein the semiconductor layer comprises a plurality of regions each one of which is the region to be a channel being sandwiched between the part of the first conductor layer and the part of the second conductor layer being neighboring each other, and W/L is 50 or more and 500 or less, wherein the W denotes a sum of lengths of facing portions in the plurality of regions, each of the facing portions being a portion at which the part of the first conductor layer and the part of the second conductor layer neighboring each other face each other, and the L denotes an interval between the first conductor layer and the second conductor layer at the facing portion.

6. A manufacturing method of an organic-EL display apparatus, the method comprising:

forming, over a substrate, a drive circuit comprising a thin-film transistor for driving an organic light-emitting element;

forming an inorganic insulating layer and an organic insulating layer on a surface of the drive circuit;

forming, in the organic insulating layer and the inorganic insulating layer, a contact hole to reach the thin-film transistor for driving;

forming a conductor layer by forming a titanium layer and a copper layer or a copper alloy layer on a surface of the organic insulating layer and at an interior of the contact hole;

planarizing the conductor layer of the surface of the organic insulating layer by removing the conductor layer of the surface of the organic insulating layer by polishing and further polishing the surface of the organic insulating layer so that arithmetic average roughness Ra is 20 nm or more, and 50 nm or less; and forming the organic light-emitting element on a surface of the conductor layer by successively forming a first electrode, an organic light-emitting layer, and a second electrode, wherein the thin-film transistor is formed by a deposition structure of a gate electrode, a gate insulating layer, an amorphous semiconductor layer comprising a region to be a channel and extending along the region to be the channel, and a first conductor layer to be a drain electrode and a second conductor layer to be a source electrode formed in connection with the amorphous semiconductor layer;

the first conductor layer and the second conductor layer are formed such that a part of each of the first conductor layer and the second conductor layer is arranged to alternatively line up in a given direction and the channel is formed to substantially overlap an entire surface of a light-emitting region of the organic light-emitting element;

the channel is the amorphous semiconductor layer sandwiched between the part of the first conductor layer and the part of the second conductor layer adjacent to each other; and in forming of the first electrode, after forming a silver layer or an APC (silver-palladium-copper alloy) layer on a surface of the copper layer or the copper alloy layer, an ITO (Indium-Tin-Oxide) layer is formed and then patterning is carried out.

7. The manufacturing method of the organic-EL display apparatus according to claim 6, wherein in between the amorphous semiconductor layer, and the first conductor layer and the second conductor layer, a semiconductor layer of a high impurity concentration is interposed.

* * * * *